United States Patent
Garting et al.

(10) Patent No.: US 10,037,831 B2
(45) Date of Patent: Jul. 31, 2018

(54) METHODS OF NANOWIRE FUNCTIONALIZATION, DISPERSION AND ATTACHMENT

(71) Applicant: SOL VOLTAICS AB, Lund (SE)

(72) Inventors: Tommy Mikael Garting, Lund (SE); Maria Huffman, Lund (SE); Lars Göran Stefan Ulvenlund, Lund (SE); Johan Eric Borgström, Lund (SE); Umear Naseem, Lund (SE)

(73) Assignee: SOL VOLTAICS AB, Lund (SE)

( * ) Notice: Subject to any disclaimer, the term of this patent is extended or adjusted under 35 U.S.C. 154(b) by 78 days.

(21) Appl. No.: 14/391,898

(22) PCT Filed: Apr. 11, 2013

(86) PCT No.: PCT/SE2013/050389
§ 371 (c)(1),
(2) Date: Oct. 10, 2014

(87) PCT Pub. No.: WO2013/154490
PCT Pub. Date: Oct. 17, 2013

(65) Prior Publication Data
US 2015/0102284 A1 Apr. 16, 2015

Related U.S. Application Data

(60) Provisional application No. 61/623,137, filed on Apr. 12, 2012.

(51) Int. Cl.
*H01B 1/20* (2006.01)
*H01B 1/22* (2006.01)
(Continued)

(52) U.S. Cl.
CPC .............. *H01B 1/20* (2013.01); *B05D 1/202* (2013.01); *B22F 1/0022* (2013.01);
(Continued)

(58) Field of Classification Search
CPC ... H01B 1/00; H01B 1/02; H01B 1/04; H01B 1/20; H01B 1/22; H01B 1/24; H01B 1/14;
(Continued)

(56) References Cited

U.S. PATENT DOCUMENTS 7,105,052 B1    9/2006  Schlenoff
7,718,995 B2 *  5/2010  Kawashima ........... B82Y 10/00
                                                    257/24
(Continued)

FOREIGN PATENT DOCUMENTS

CN    1656264 A    8/2005
CN    1925879 A    3/2007
(Continued)

OTHER PUBLICATIONS

International Search Report from European Patent Office for PCT/SE2013/050389, dated Oct. 1, 2013.
(Continued)

*Primary Examiner* — Harold Pyon
*Assistant Examiner* — Matthew R Diaz
(74) *Attorney, Agent, or Firm* — The Marbury Law Group PLLC

(57) ABSTRACT

A nanowire device and a method of making a nanowire device are provided. The device includes a plurality of nanowires functionalized with different functionalizing compounds. The method includes functionalizing the nanowires with a functionalizing compound, dispersing the nanowires in a polar or semi-polar solvent, aligning the nanowires on a substrate such that longitudinal axes of the nanowires are oriented about perpendicular to a major surface of the substrate, and fixing the nanowires to the substrate.

9 Claims, 23 Drawing Sheets

(51) Int. Cl.
*H01B 1/24* (2006.01)
*B22F 1/00* (2006.01)
*C09D 11/52* (2014.01)
*B82Y 10/00* (2011.01)
*B82Y 40/00* (2011.01)
*B05D 1/20* (2006.01)
*H01L 29/66* (2006.01)
*H01L 29/06* (2006.01)
*H01L 51/00* (2006.01)
*H01L 29/16* (2006.01)
*H01L 29/20* (2006.01)
*H01L 29/22* (2006.01)
*B29L 31/00* (2006.01)

(52) U.S. Cl.
CPC .......... *B22F 1/0025* (2013.01); *B22F 1/0062* (2013.01); *B82Y 10/00* (2013.01); *B82Y 40/00* (2013.01); *C09D 11/52* (2013.01); *H01B 1/22* (2013.01); *H01B 1/24* (2013.01); *H01L 29/0676* (2013.01); *H01L 29/66469* (2013.01); *B29L 2031/707* (2013.01); *H01L 29/16* (2013.01); *H01L 29/20* (2013.01); *H01L 29/22* (2013.01); *H01L 51/0049* (2013.01)

(58) Field of Classification Search
CPC . H01B 1/16; H01B 1/18; B82Y 10/00; B82Y 30/00; B82Y 40/00; B22F 1/0018; B22F 1/0022; B22F 1/0025; B22F 1/004; B22F 1/0044; B22F 1/0059; B22F 1/0062; H01L 29/0665; H01L 29/0669; H01L 29/0673; H01L 29/0676; H01L 29/12; H01L 29/18; H01L 29/1604; H01L 29/1608; H01L 29/161; H01L 29/165; H01L 29/167; H01L 29/20; H01L 29/2003; H01L 29/2006; H01L 29/201; H01L 29/205; H01L 29/207; H01L 29/22; H01L 29/2203; H01L 22/2206; H01L 29/221; H01L 29/225; H01L 29/227; H01L 29/24; H01L 29/242; H01L 29/245; H01L 29/247; H01L 29/26; H01L 29/263; H01L 29/267; H01L 31/036–31/03928; H01L 29/16; H01L 29/2206; H01F 1/0072; H05K 1/097; C09D 11/52; B05D 1/20; B05D 1/202; B05D 1/204; B05D 1/206
See application file for complete search history.

(56) References Cited

U.S. PATENT DOCUMENTS

| | | | | |
|---|---|---|---|---|
| 7,780,875 B2* | 8/2010 | Asgari | ................... | B82Y 30/00 252/502 |
| 7,833,616 B2* | 11/2010 | Jeon | ................... | B82Y 10/00 428/216 |
| 7,880,318 B1 | 2/2011 | Kamins et al. | | |
| 7,959,974 B2* | 6/2011 | Mirkin | ................... | B05D 1/185 264/29.1 |
| 2004/0219093 A1* | 11/2004 | Kim | ................... | B82Y 30/00 423/447.2 |
| 2005/0032226 A1* | 2/2005 | Natan | ................... | B01J 13/0047 506/4 |
| 2005/0164432 A1* | 7/2005 | Lieber | ................... | B01J 23/50 438/149 |
| 2006/0240492 A1 | 10/2006 | Rusling et al. | | |
| 2006/0286023 A1* | 12/2006 | Huang | ................... | B82Y 10/00 423/447.1 |
| 2007/0269924 A1* | 11/2007 | Gomez | ................... | B81C 1/0038 438/99 |
| 2008/0199626 A1* | 8/2008 | Zhou | ................... | B05D 1/18 427/430.1 |
| 2008/0202579 A1* | 8/2008 | Gur | ................... | B82Y 30/00 136/252 |
| 2009/0246408 A1* | 10/2009 | Chan | ................... | B82Y 10/00 427/577 |
| 2010/0189901 A1* | 7/2010 | Chung | ................... | B22F 9/24 427/256 |
| 2011/0006269 A1* | 1/2011 | Petruska | ................... | B01J 13/00 252/518.1 |
| 2011/0253668 A1* | 10/2011 | Winoto | ................... | B82Y 10/00 216/13 |
| 2011/0315954 A1* | 12/2011 | Jang | ................... | B82Y 30/00 257/13 |
| 2012/0077034 A1* | 3/2012 | Heitsch | ................... | B82Y 30/00 428/401 |

FOREIGN PATENT DOCUMENTS

| | | | | |
|---|---|---|---|---|
| CN | 102123698 A | 7/2011 | | |
| EP | 2298968 A2 * | 3/2011 | ............. | B01J 23/50 |
| EP | 2436722 A1 | 4/2012 | | |
| WO | 2004099307 A2 | 11/2004 | | |
| WO | 2006137940 A2 | 12/2006 | | |
| WO | 2007081501 A1 | 7/2007 | | |
| WO | 2008057614 A2 | 5/2008 | | |

OTHER PUBLICATIONS

Chinese First Office Action for Chinese Patent Application No. 201380030869.4, dated Oct. 8, 2016, with English Language translation, 10 pages.

Second Chinese Office Action for Chinese Patent Application No. 201380030869.4, dated Jun. 19, 2017, with English Language translation, 15 pages.

Third Chinese Office Action and Search Report for Chinese Patent Application No. 201380030869.4, dated Jan. 3, 2018, 6 pages.

\* cited by examiner

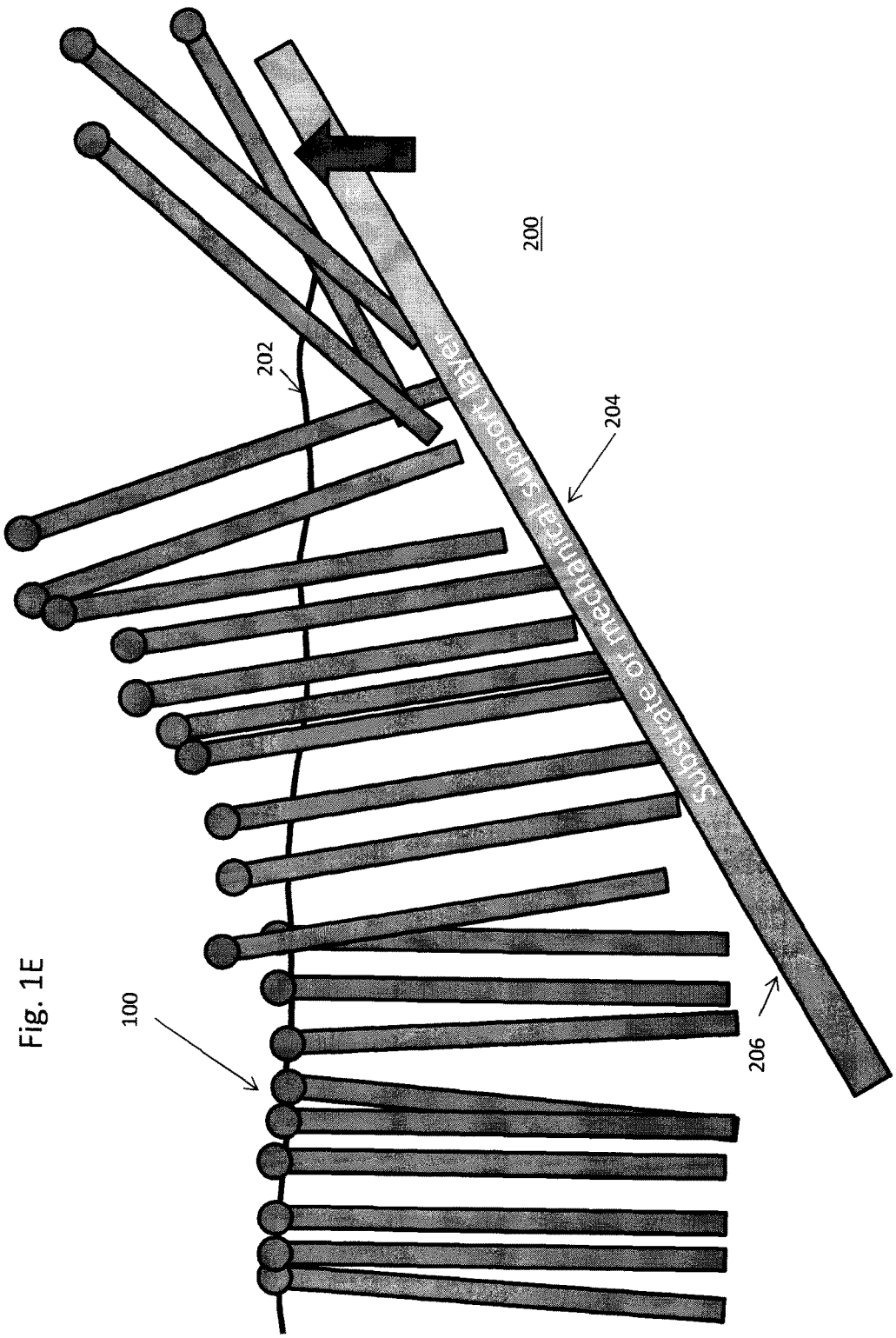

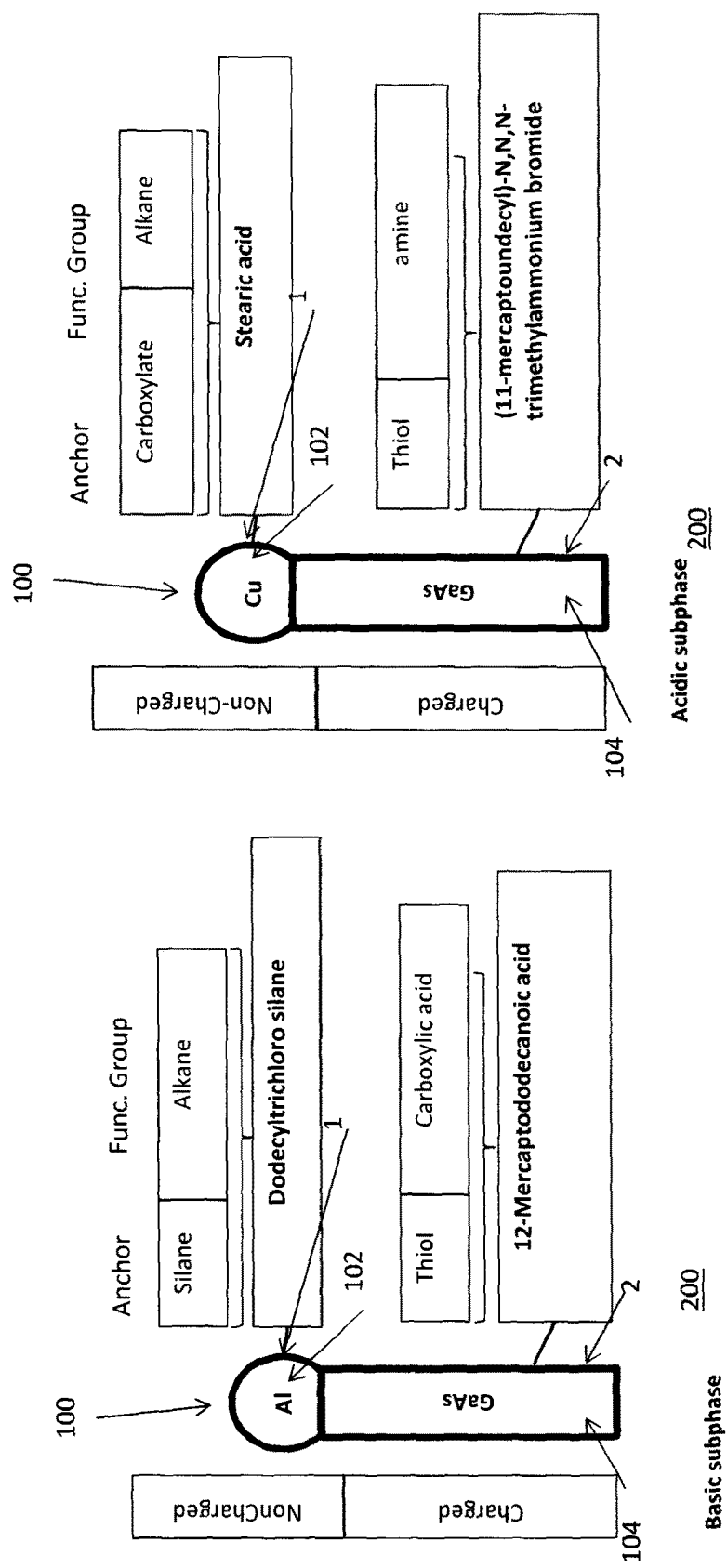

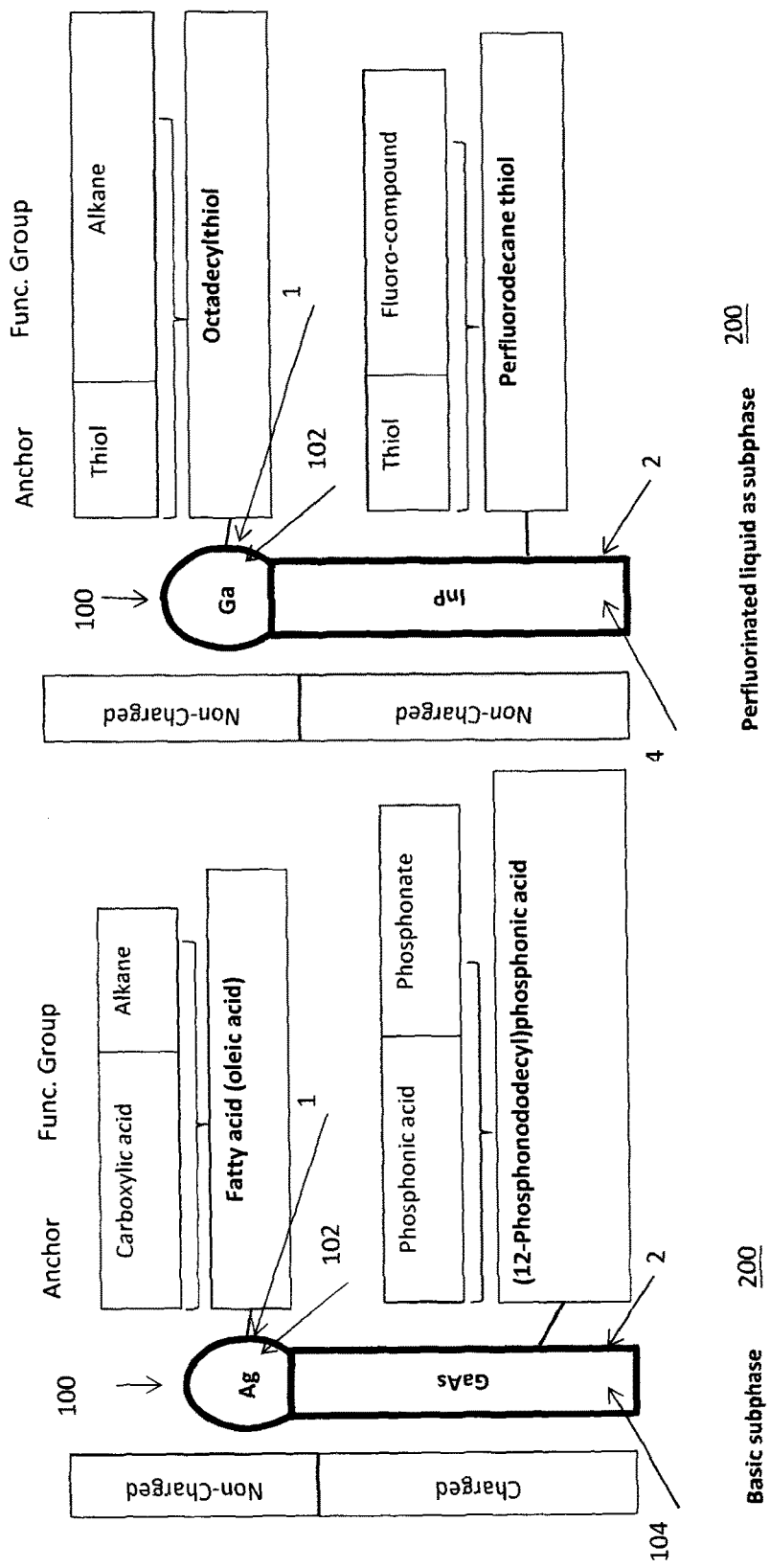

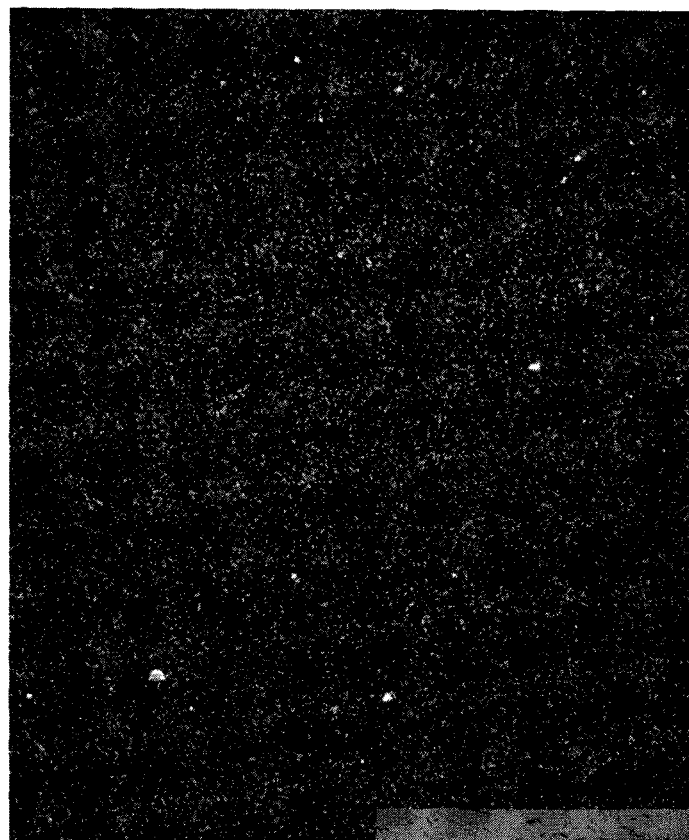
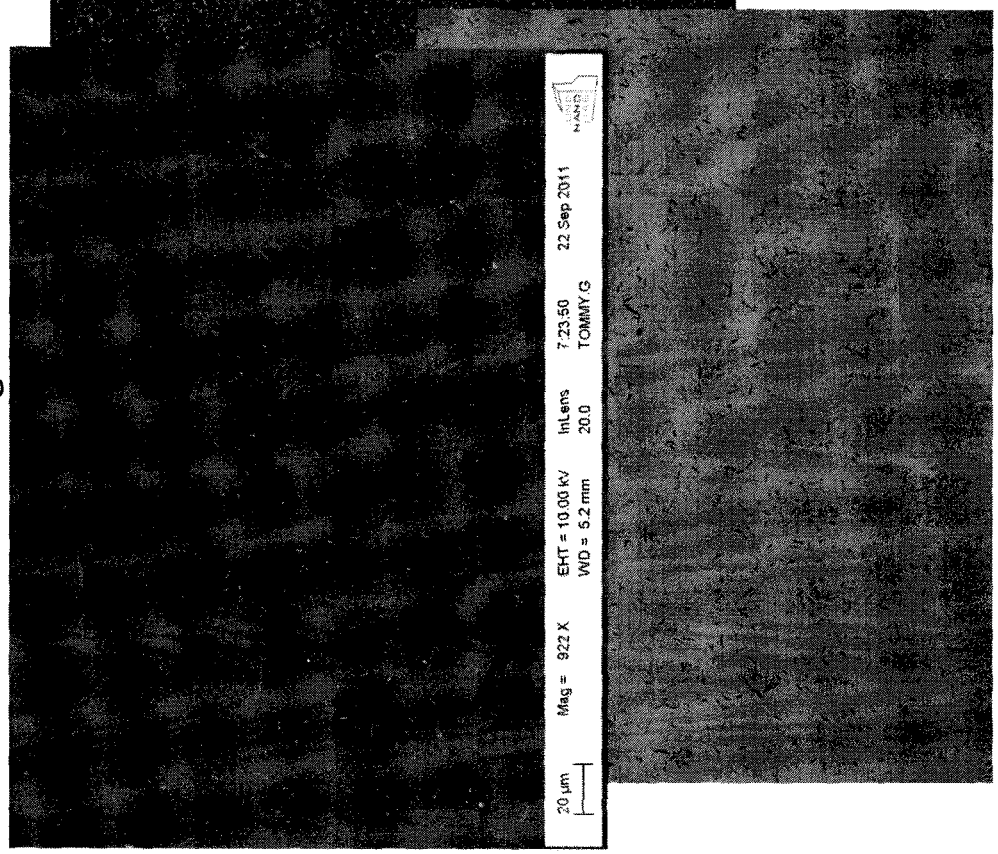
Fig. 5A
Fig. 5B
Fig. 5C
Aggregation free deposition

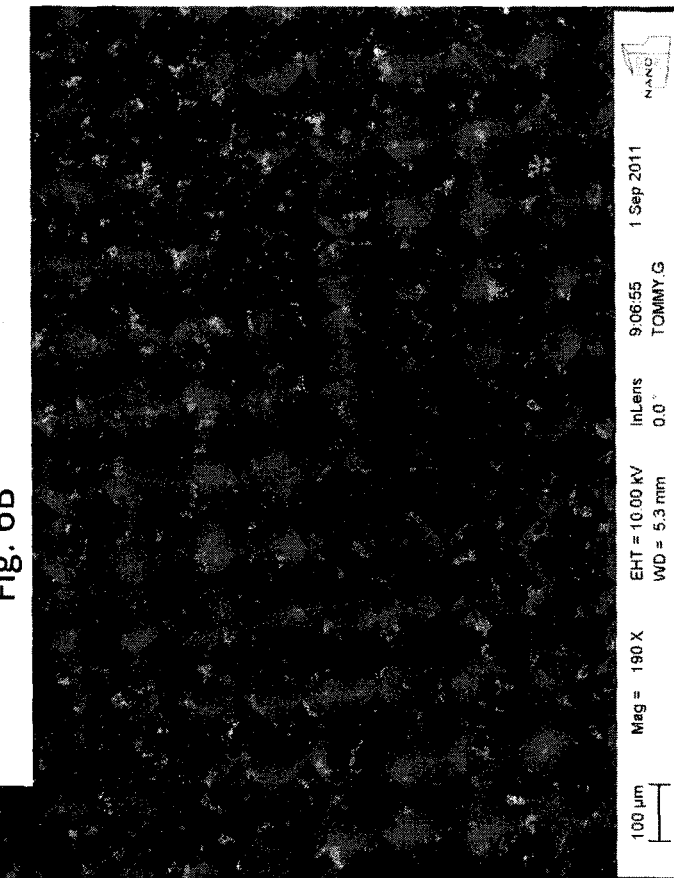
Fig. 6A
Fig. 6B
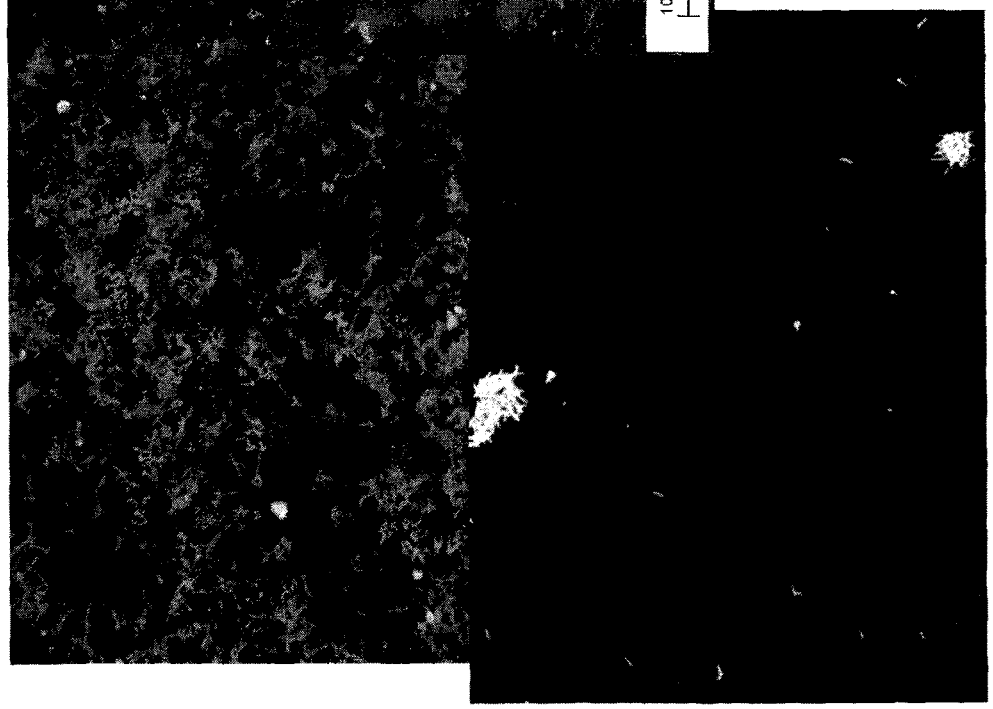
Fig. 6C
No/poor surface treatment

- Dispersability of NWs has been increased, denser low-aggregation inks have been made.
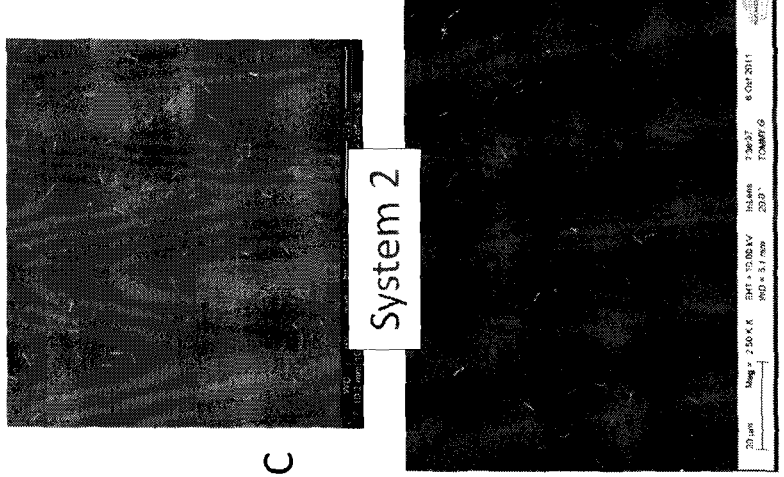
Fig. 7C
Fig. 7D
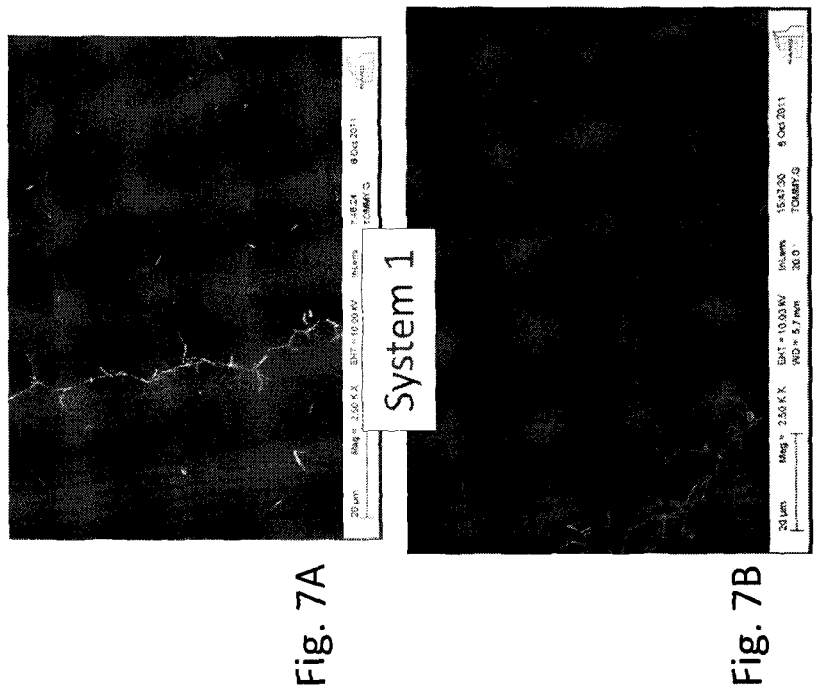
Fig. 7A
Fig. 7B

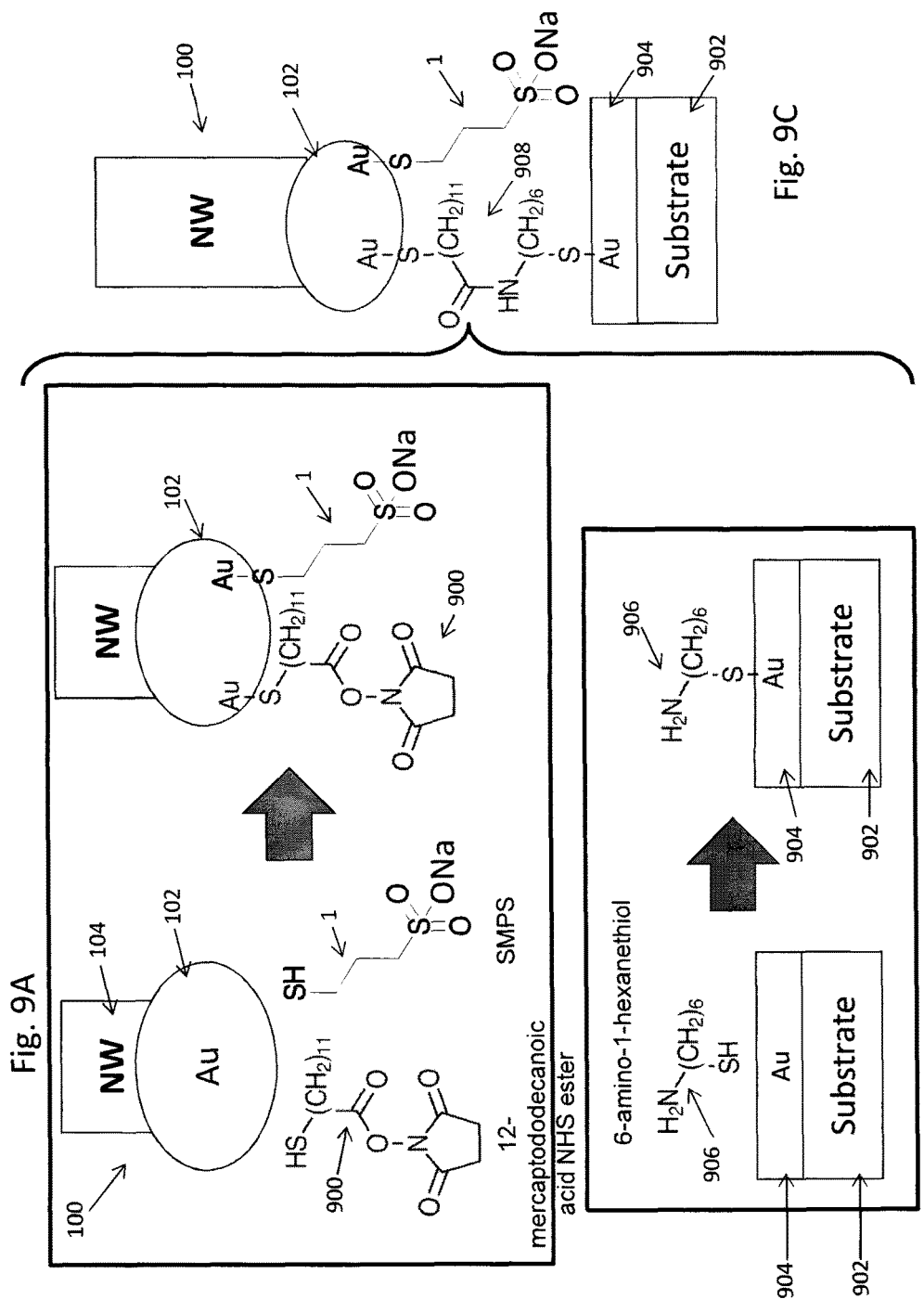

METHODS OF NANOWIRE FUNCTIONALIZATION, DISPERSION AND ATTACHMENT

FIELD

The present invention relates to formation of nanowire devices and in particular to functionalization, dispersion, orientation and attachment of nanowires to make nanowire devices.

BACKGROUND

Conventionally, nanowire electronic devices have been fabricated by growing the nanowires on the device substrates. However, the production costs of fabricating devices by this method are high and the scalability is low. Alternatively, nanowires may be separately fabricated by liquid phase synthesis, such as colloidal chemistry, or gas phase synthesis and subsequently deposited on the substrate. However, conventional nanowire prefabrication and deposition processes are costly and suffer from inferior quality.

Nanowires can be arranged in layers on surfaces in many ways for various purposes. For example the nanowires may be arranged to create transparent, conductive films. In one case, silver nanowires were arranged randomly and in parallel to the film surface forming a conductive layer at very low concentrations of nanowires (see Bergin et al., Nanoscale, 2012, 4, 1996-2004). Another purpose is producing nanostructured polymeric films has been to produce membranes, for example useful in different separation and purification steps (see European Published Application EP 2 436 722 A1). Here the nanoparticles are used as templates to create holes in the membrane and may be removed after crosslinking the membrane. There have also been attempts to align nanowires perpendicular to a supporting surface by controlling the rate of evaporation of the solvent (see Baker, Nano Lett., January 2010; 10(1): 195-201). However, this produced a fragile nanowire assembly. Furthermore, the drying method may be difficult to use on an industrial scale since the drying front ("coffee-ring effect") will tend to transport material laterally, making a homogeneous monolayer difficult to attain.

SUMMARY

An embodiment relates to a method of making a nanowire device comprising a plurality of nanowires, the nanowires having a first portion and a second portion. The method comprises functionalizing the first portions of the nanowires with a first functionalizing compound, dispersing the plurality of nanowires in a polar or semi-polar solvent, aligning the plurality of nanowires on a substrate such that longitudinal axes of the nanowires are oriented substantially perpendicular to a major surface of the substrate, and fixing the plurality of nanowires to the substrate. Optionally, the second portions of the nanowires may be functionalized with a second functionalizing compound which may be different from the first functionalizing compound.

BRIEF DESCRIPTION OF THE DRAWINGS

FIGS. 1B, 1C, 1D, 1E, 1F and 1G are respective schematic side views of uniaxially, unidirectionally aligned nanowires on a surface of a liquid, a LB technique for removing the nanowires from the surface, a LS technique for removing the nanowires from the surface, an alternative technique for removing the nanowires from the surface, the nanowires in a polymer binder matrix material which is insoluble with the liquid, and the nanowires in a polymer binder matrix material which is soluble with the liquid.

FIGS. 1H through 1O are schematic illustrations of non-limiting examples of combinations of nanowire, functionalization and liquid subphase materials.

FIG. 5A is a scanning electron microscopy (SEM) micrograph illustrating aggregation free deposition of an embodiment.

FIG. 5B is an optical micrograph illustrating aggregation free deposition of the embodiment of FIG. 5A.

FIG. 5C is a higher magnification optical micrograph illustrating aggregation free deposition of the embodiment of FIG. 5B.

FIG. 6A is an optical micrograph illustrating agglomeration of nanowires with no or poor surface treatment.

FIG. 6B is an SEM micrograph illustrating agglomeration of nanowires with no or poor surface treatment of the embodiment in FIG. 6A.

FIG. 6C is an optical micrograph illustrating severe agglomeration of nanowires with no or poor surface treatment.

FIG. 7A and FIG. 7B are SEM micrographs illustrating "chaining" of nanowires exhibited in an embodiment.

FIG. 7C and FIG. 7D are SEM micrographs illustrating the lack of agglomeration of nanowires exhibited in another embodiment.

FIGS. 9A-9C present a schematic illustration of steps in a method of attaching nanowires to a substrate according to an embodiment.

DETAILED DESCRIPTION

Embodiments include methods of fabricating nanowire devices and nanowire devices made by the methods. A nanowire is a structure with a diameter (or width in the case of hexagonal shaped nanowires) less than 1 micron, such as 10-500 nm. The length may be greater than 1 micron. The length to diameter/width ratio may be 10:1 or greater, such as 5:1 or greater. An embodiment includes an integrated method that starts with loose nanowires and ends with a completed nanowire device and devices made by the method. Other embodiments are drawn to methods of performing steps within the integrated method and intermediate products made by those methods. Embodiments allow for the manufacturing of a semiconductor device based on the collection, functionalization, dispersion, alignment, deposition, densification and attachment of nanowires on a solid substrate.

In addition to semiconductor nanowires, embodiments of nanowires include other elongated (e.g. rod, horn, or wire shaped nanoelements made of metals, insulators, carbon nanotubes and elongated biological/organic structures). Devices made by the methods include, but are not limited to, solar cells, light emitting diodes (LEDs), textured electrodes and sensors. Other devices that may be made include memory devices and lab-on-chip devices.

Embodiments include semiconductor nanowire devices and methods of making the devices. The nanowires may be made of Group III-V, II-VI and IV semiconductor materials, such as GaAs, InP, InAs, $GaAs_xP_{1-x}$, $In_xGa_{1-x}P$, InGaAsP, GaN, InN, $Ga_xIn_{1-x}N$, GaP, InSb, GaSb, $In_xAl_{1-x}Sb$ $Ga_xAl_{1-x}Sb$, AlN, BN, Si and SiC.

Figure 1A:
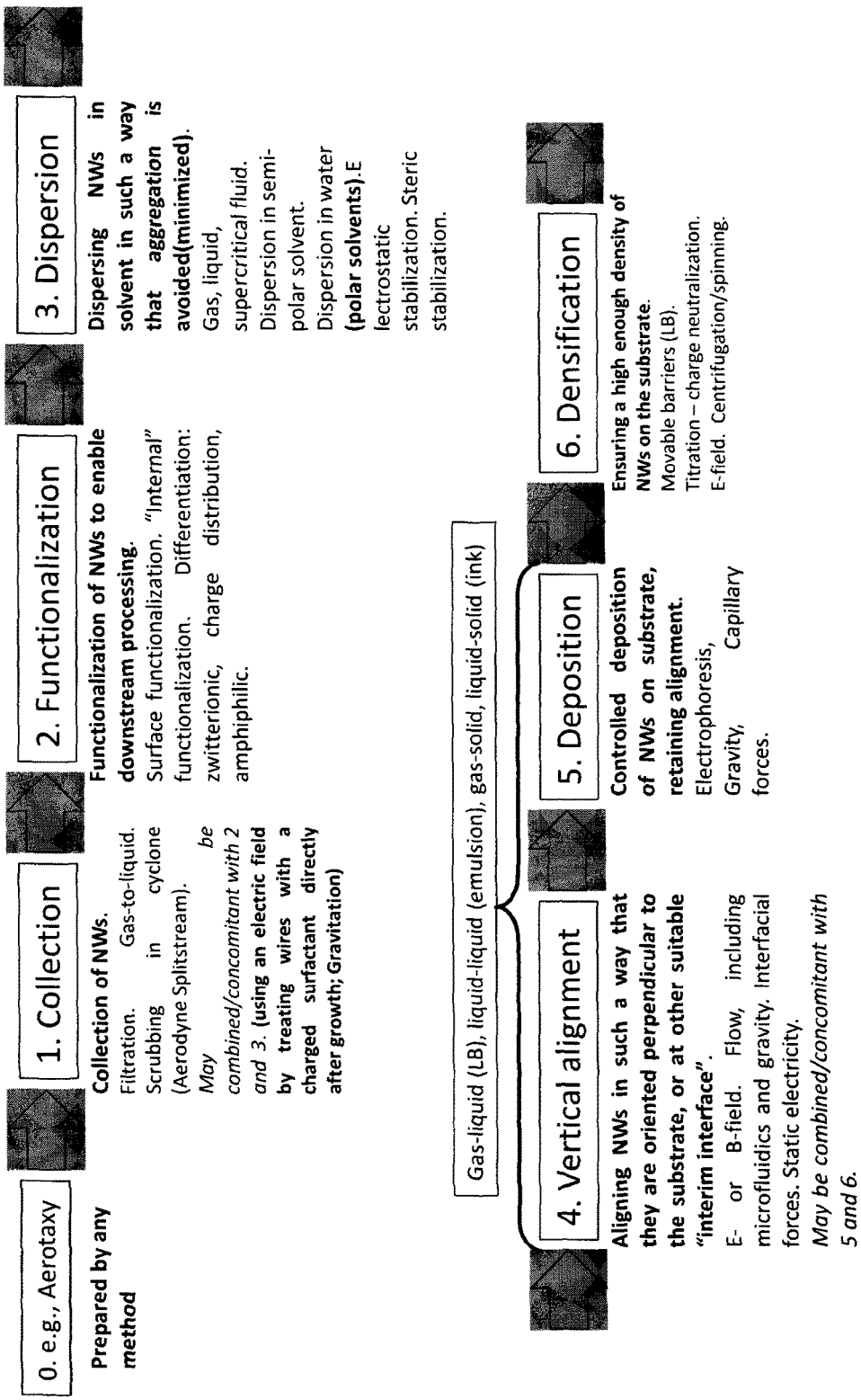
FIG. 1A is a flow diagram illustrating embodiments of methods of nanowire functionalization, dispersion and attachment.
Figure 1A:
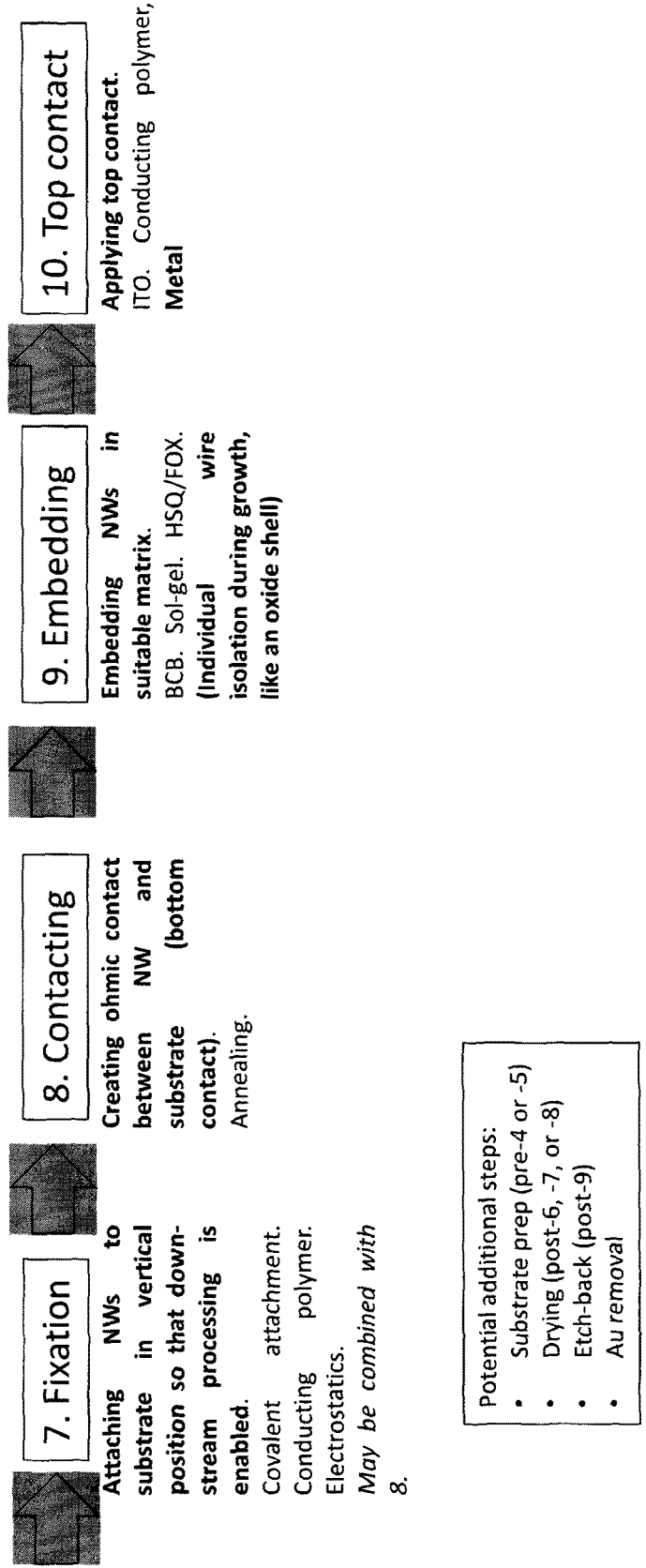

A first embodiment is illustrated in the flow diagram of FIG. 1A. As denoted by step 0 in the flow diagram illustrated in FIG. 1A, the fabrication of the nanowires is not a step in the embodiments disclosed below. That is, the nanowires are provided pre-made by any suitable method and may be provided either loose or attached to a substrate. For example, the nanowires may be epitaxially grown on a substrate and supplied still attached to the substrate, made by liquid phase synthesis, such as colloidal chemistry, or made by gas phase synthesis, such as laser assisted catalytic growth or by an Aerotaxy™ method as described in PCT Published Application WO 11/142,717 (the '717 publication), assigned to Qunano AB and hereby incorporated by reference in its entirety.

In step 1 of this embodiment, the nanowires are collected. In this step, the nanowires are separated from the carrier substrate if supplied on a substrate. Alternatively, if loose nanowires are supplied, the loose nanowires may be scrubbed in a cyclone, filtered and/or subjected to other gas/liquid separation techniques if the nanowires are supplied in a liquid carrier.

In step 2, the nanowires are functionalized, as described in more detail below with respect to FIG. 2. For example, a first part of the nanowire is functionalized in a first liquid medium. Optionally, a sacrificial or protective layer on a second part of the nanowire is etched away after functionalizing the first part of the nanowire. The second part of the nanowire is then functionalized in a second liquid medium.

In step 3, the functionalized nanowires are dispersed in solvent. Preferably, the nanowires are dispersed in a third liquid medium (e.g., dispersive agent different from the first and second liquid mediums) which reduces or minimizes the aggregation (e.g., agglomeration) of functionalized nanowires in the medium. The third liquid medium may comprise one or more solvents, as described in Table I below.

In step 4, the nanowire suspension is subject to an applied force that causes the nanowires to orient such that the longitudinal axis of the nanowires is perpendicular to a surface, such as a major substrate surface. This surface can be a solid or a liquid surface, and its main purpose is to function as the dedicated surface for densification or alignment, unless densification is performed in the liquid medium, as exemplified by evaporation and/or centrifugation. The solid surface may comprise the major solid substrate surface itself.

The liquid surface may comprise the surface of the liquid medium in which the nanowires are functionalized and/or dispersed. Alternatively, and more preferably, the liquid surface comprises a surface of a fourth liquid medium different from the first, second or third liquid mediums. In this embodiment, the nanowires are aligned on the surface of the fourth liquid medium after functionalization (and after dispersion, if present) and before being transferred to the major surface of a solid substrate. In this case, the nanowires in the first, second or third liquid are deposited on a surface of the fourth liquid medium (e.g., water or other liquids described below) and the first, second or third medium is transported away from the surface of the fourth liquid (e.g., by evaporation, dissolution into the fourth liquid, etc.).

As discussed in more detail below, the functionalized nanowires include at least one functionalizing compound. In one non-limiting embodiment, this compound is charged. Charged functionalized nanowires may be aligned by applying an electric or magnetic field that causes the nanowires to align with the field as described in PCT Published Application WO 11/078780, hereby incorporated by reference in its entirety. However, non-eharged (i.e., uncharged) compounds may also be used. Other aligning forces include, but are not limited to, microfluidic flow, gravity, interfacial forces and static electricity.

Next, in step 5, the nanowires are deposited on the substrate while retaining alignment. Deposition may be performed with electrophoresis, gravity and/or capillary forces. It can also be performed by embedding the nanowires in place using a polymer (or monomer) that may be curable. In an embodiment, steps 4 and 5 may be combined or their order reversed such that the alignment of step 4 follows the deposition of step 5.

Additionally, the nanowire solutions may include gas-liquid, liquid-liquid (emulsion), gas-solid, or liquid-solid (ink) systems. If the nanowires are aligned on a liquid surface, then the nanowires may be deposited on a major surface of a solid substrate using any suitable liquid-solid transfer techniques. Transfer techniques include monolayer transfer techniques, such as the Langmuir-Blodgett (LB) technique in which the substrate is inserted into the liquid through the nanowire monolayer and then removed coated a nanowire containing monolayer film or ink, or the Langmuir-Schaefer (LS) technique in which the major surface of the solid substrate is contacted to or moved horizontally on the nanowire containing monolayer on the surface of the liquid and then removed coated with a nanowire containing monolayer film or ink. If the substrate is coated with an ink, then the solvent of the ink is removed (by heated drying, evaporation, centrifugation, etc.) to leave a nanowire film on the substrate.

In step 6, the deposited nanowires are optionally densified. That is, the nanowires are moved across the surface to increase the surface concentration. Techniques for densifying the nanowires on a surface or in a liquid include moveable barriers, titration and centrifugation/spinning. For example, for nanowires on a surface of a liquid, the movable barriers, such as LB or LS type barriers may be used to push the aligned nanowires on the liquid surface closer together. Densification may also be accomplished by applying an electric field and by charge neutralization. If desired, the densification step 3 may be conducted while the nanowires are located in a liquid (i.e., at the same time as steps 2, 3 and/or 4, or before step 2, or between steps 2 and 3, or between steps 3 and 4, or between steps 4 and 5).

In step 7, the nanowires are fixed in place on the substrate. As discussed in more detail below, the nanowires may be fixed by forming a covalent bond between a first ligand bound to the nanowire and a second ligand bound to the substrate surface.

Figure 1B:
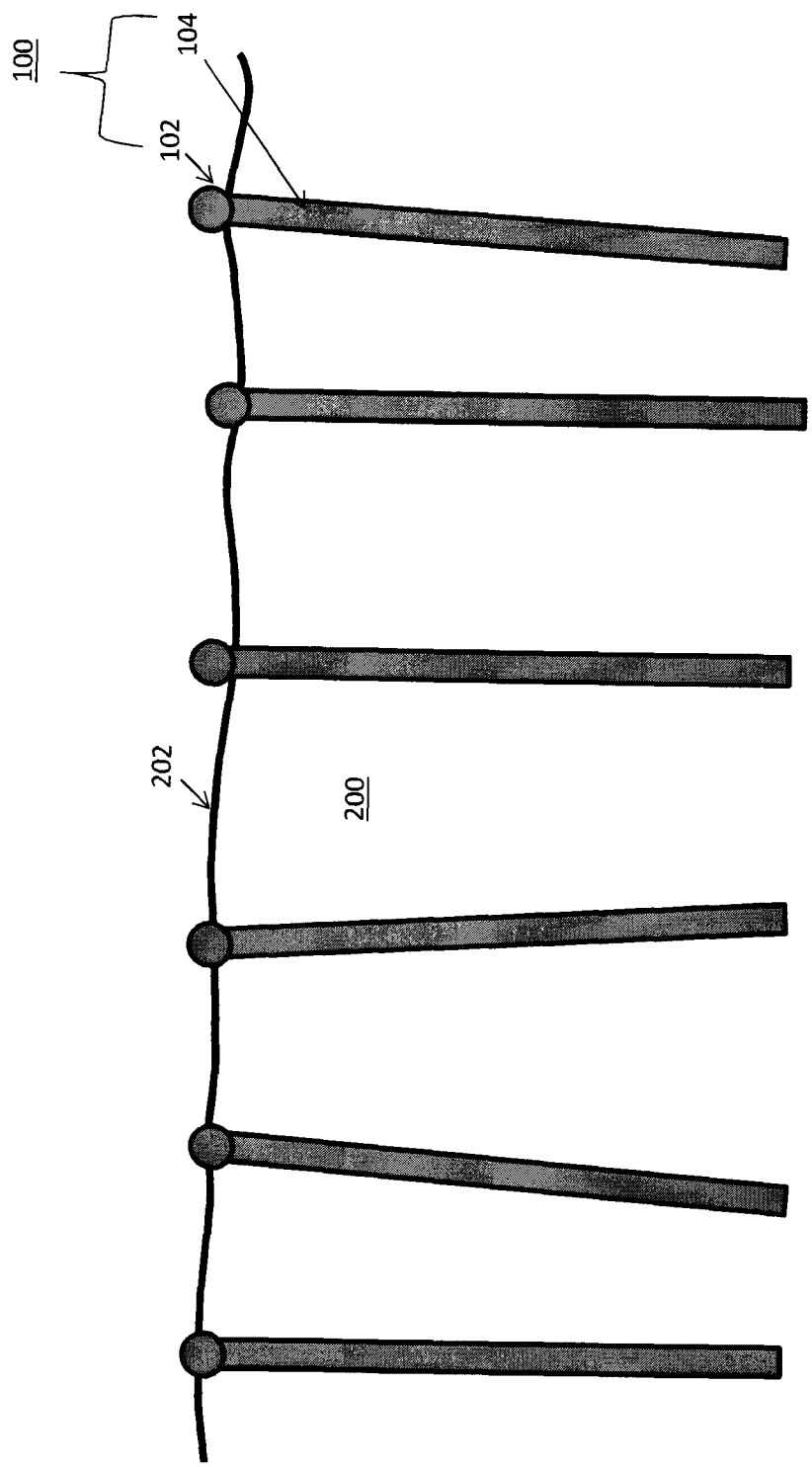

Alternatively, if the nanowires are oriented on a liquid surface, the steps 6 and 7 may have the following substeps. The liquid surface may comprise the surface of the solvent in which the nanowires are functionalized. Alternatively, as shown in FIG. 1B, the functionalized nanowires 100 may be removed from the solvent used for functionalization and placed on a surface 202 of a different liquid subphase 200, such as water, selected such that the functionalized nanowires float on the surface of the liquid in alignment (e.g., parallel or perpendicular to the surface of the liquid). For example, the nanowires 100 shown in FIG. 1B are aligned perpendicular to the surface 202 of the liquid with unidirectional orientation (e.g., catalyst particles 102 pointing "up" away from the surface 202 while the semiconductor stem 104 extends through the surface 202 into the liquid 200).

The properties of the subphase may be controlled using by selecting the subphase pH, salinity and/or temperature to achieve floating in the desired orientation, as will be described in more detail below. The liquid subphase 200 may comprise any suitable polar or semi-polar solvent with low vapor pressure at room temperature and one atmosphere pressure, for example water, glycerol, PEG, or glyceride (e.g., mono-, di- or triglyceride) solvent. Alternatively, the liquid subphase may comprise a fluorinated fluid, such as a perfluorinated fluid, for example a perfluoropolyether containing fluid, such as a heat transfer fluid comprising oxidized, polymerized 1,1,2,3,3,3-hexafluoro-propene (e.g., heat transfer fluid sold under the trade name Galden®). The nanowires may be provided on the surface of the liquid subphase as an ink which comprises a plurality of nanowires suspended in a solvent, and allowing the solvent to be transported away from the surface of the liquid subphase. The solvent is transported away by at least one of dissolution into the liquid subphase or by evaporation.

For example, the GaAs nanowires functionalized with MDA (mercaptododecanoic acid) may float on the surface of water in substantially uniaxial alignment (e.g., with the nanowire axis substantially perpendicular to the water surface plane) and with substantially same orientation (e.g., catalyst particle pointing towards or away from the water surface). As used herein, substantially perpendicular means a nanowire which is exactly perpendicular 0-20 degrees, such as 0-5 degrees from exactly perpendicular to the substrate surface. A plurality of nanowires are substantially perpendicular, aligned and/or oriented if at least 80 percent, such as 95-100 percent of the nanowires are substantially perpendicular to a surface, aligned with the other nanowires in the group and/or are oriented in the same direction as the other nanowires in the group. The MDA protects the nanowire from being etched by the water. If desired, the catalyst particle of the nanowires may be functionalized with another functionalizing compound (e.g., ODT, PFDT, PeT, etc.).

Figure 1C:
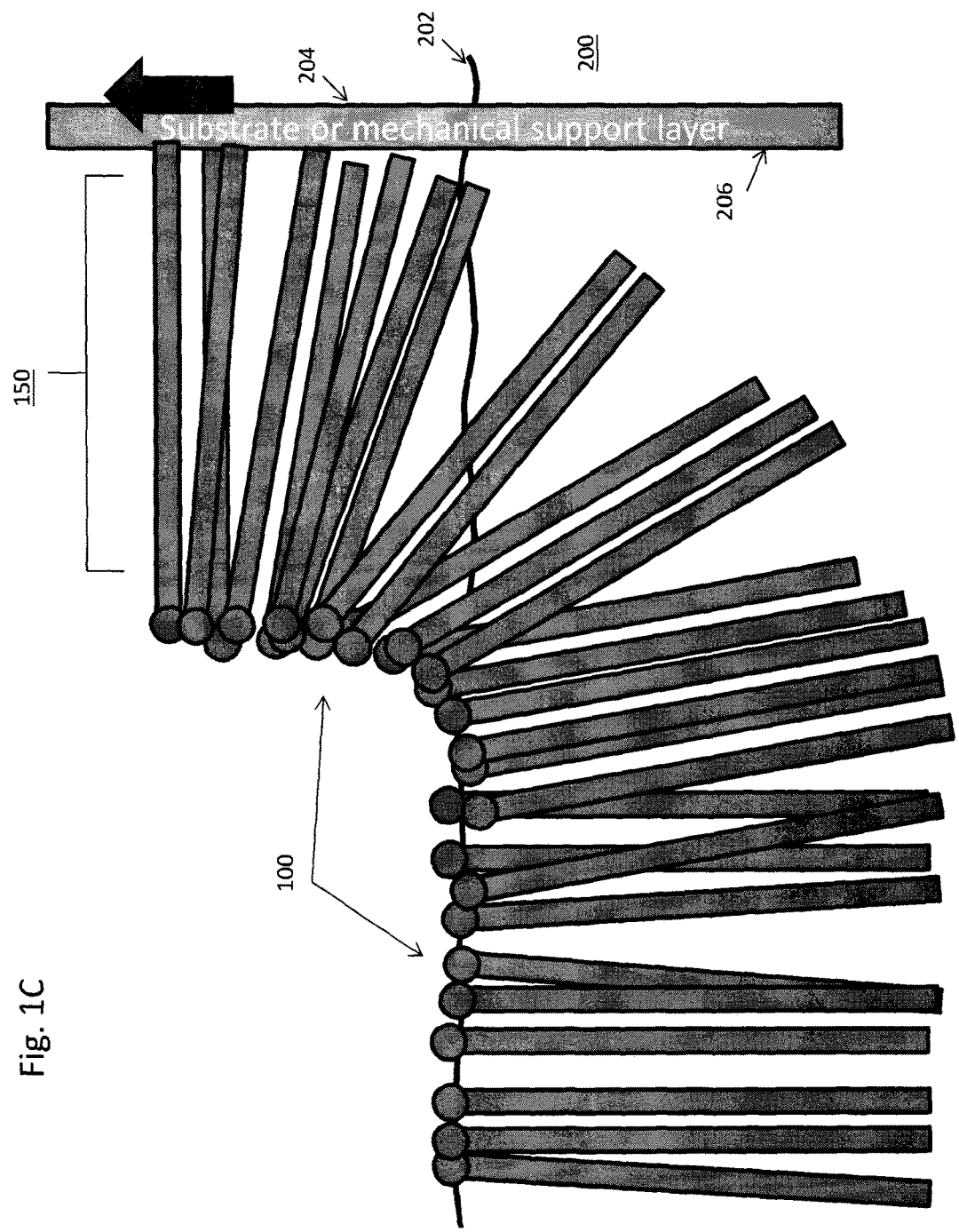

The nanowires may be densified on the surface of the liquid using a Langmuir trough or movable LB or LS barriers, followed by using the LB or LS method described above to transfer the nanowires from the liquid surface to the surface of the solid substrate. For example, as shown in FIG. 1C, in the LS method, the substrate 204 is moved in the direction of the arrow substantially perpendicular to the surface 202 of the liquid subphase 200 to form one or more monolayers 150 of uniaxially aligned and oriented (e.g., with catalyst particle pointing away from the substrate surface 206) nanowires on the surface 206 of the substrate 204. The nanowires can orient unidirectionally at the three phase line created by a vertical substrate held at the liquid (e.g., water)/air interface in the LB method.

Figure 1D:
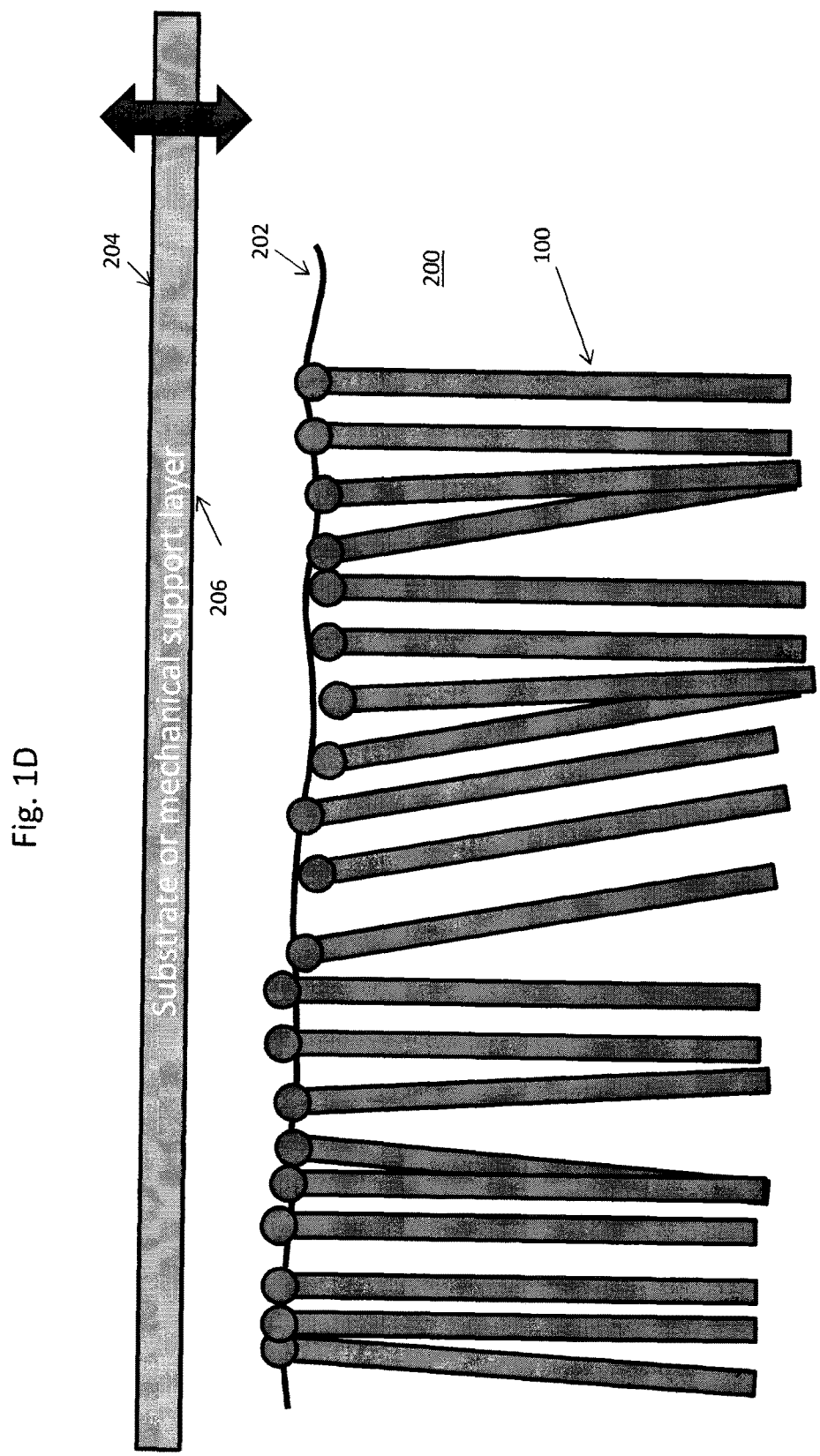

Alternatively, as shown in FIG. 1D, the nanowires can be removed from the liquid (e.g., water) surface by a horizontal substrate 204 which has a surface 206 been treated with a sticky substance (e.g., a plaster, such as a Hanaplast® spray plaster available from Beiersdorf AG which is believed to contain acrylic copolymer, polyurethane polymer, ethanol, water, and dimethyl ether), using the LS method while the nanowires keep their unidirectional alignment when attached to the sticky (e.g., adhesive) substance.

In an alternative embodiment shown in FIG. 1E, the substrate 204 may be angled diagonally at a different angle than shown in FIGS. 1C and 1D and may lift up the nanowires 100 from below (e.g., from below the surface 202 of the liquid subphase 200) in the direction of the arrow. In this embodiment of FIG. 1E, the nanowires may be aligned substantially perpendicular to the surface 206 of the substrate 204 with a few nanowires possibly out of alignment.

Figure 1F:
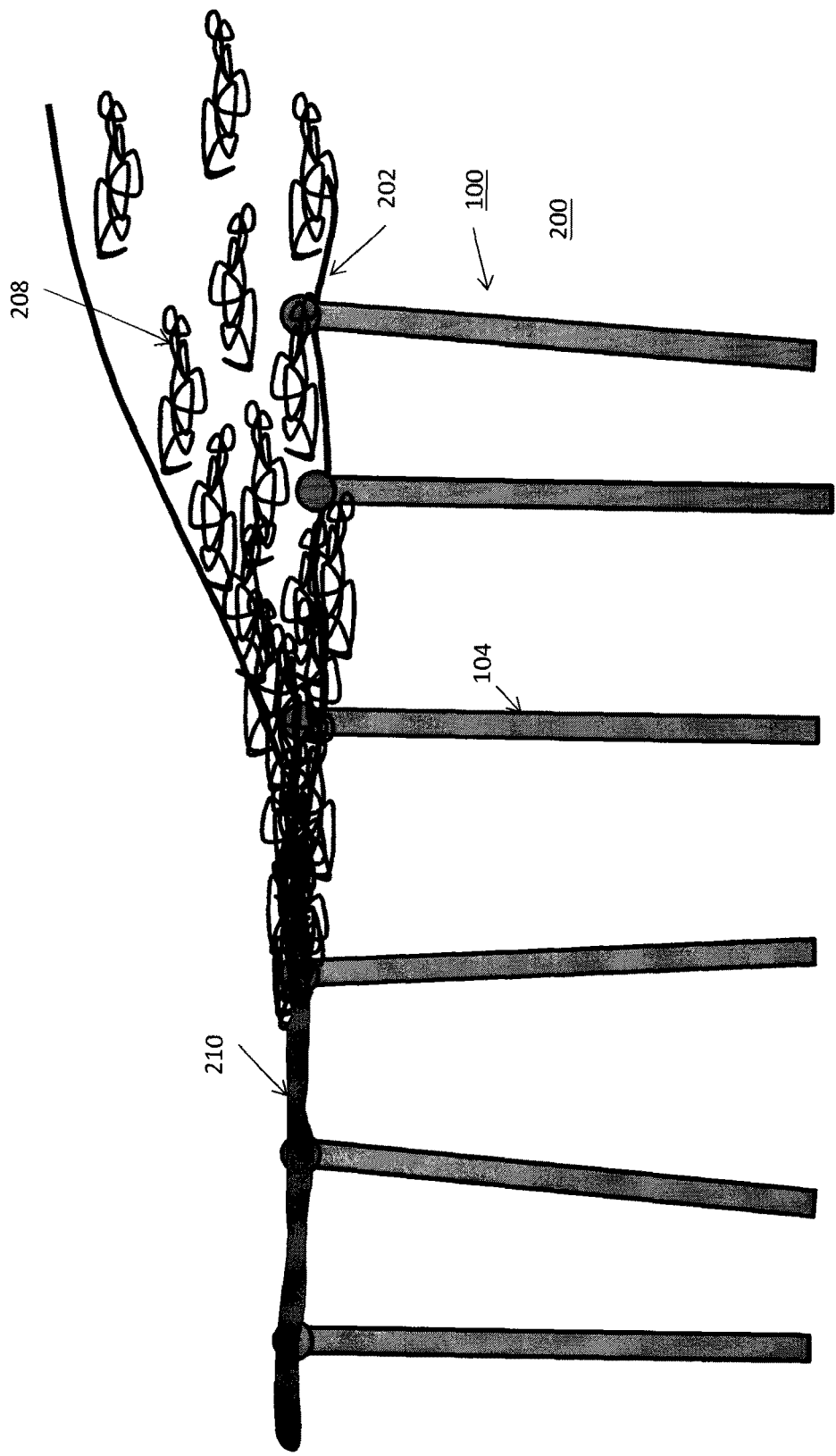
Figure 1G:
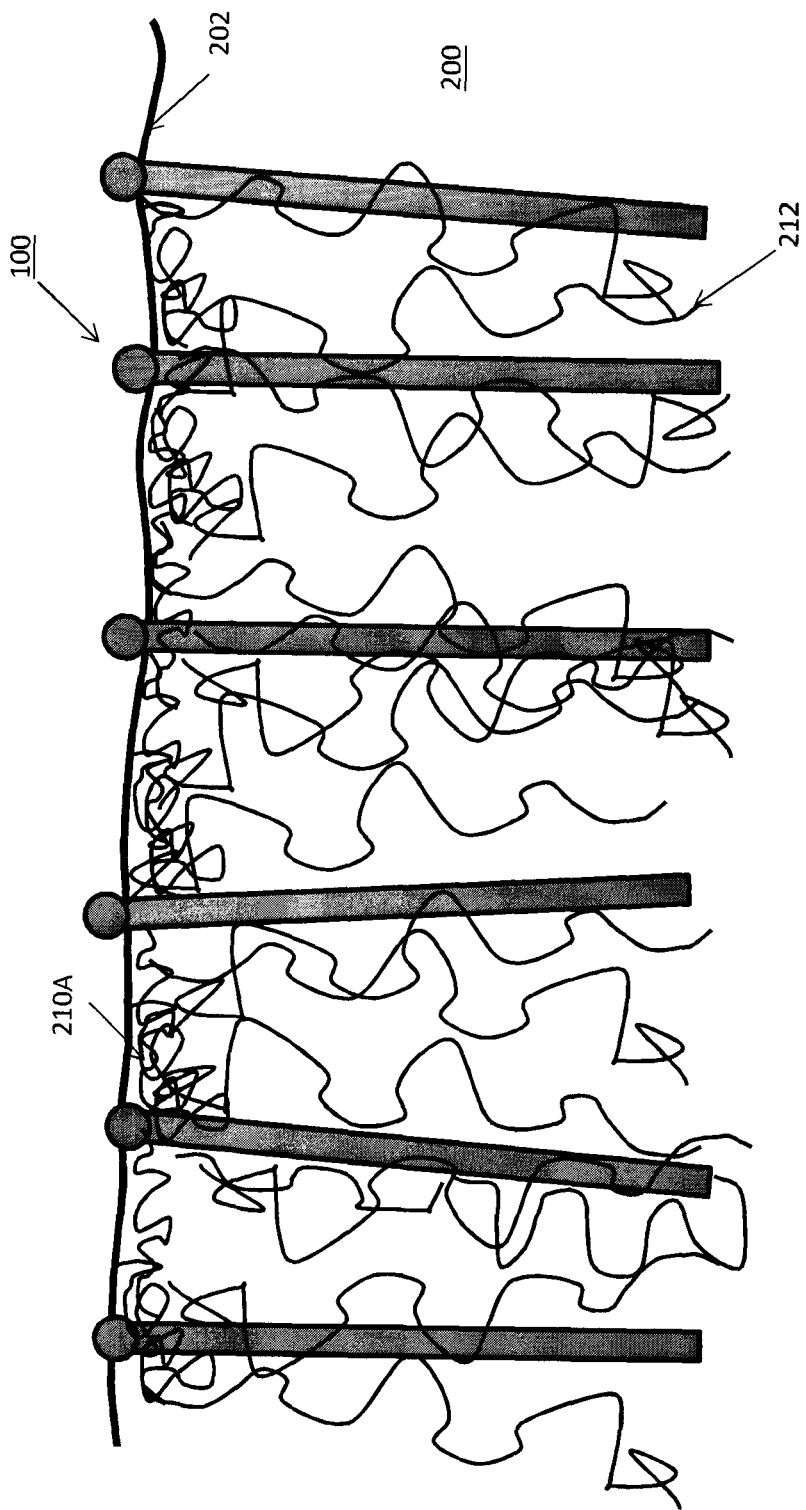
Figures 1J, 1K:
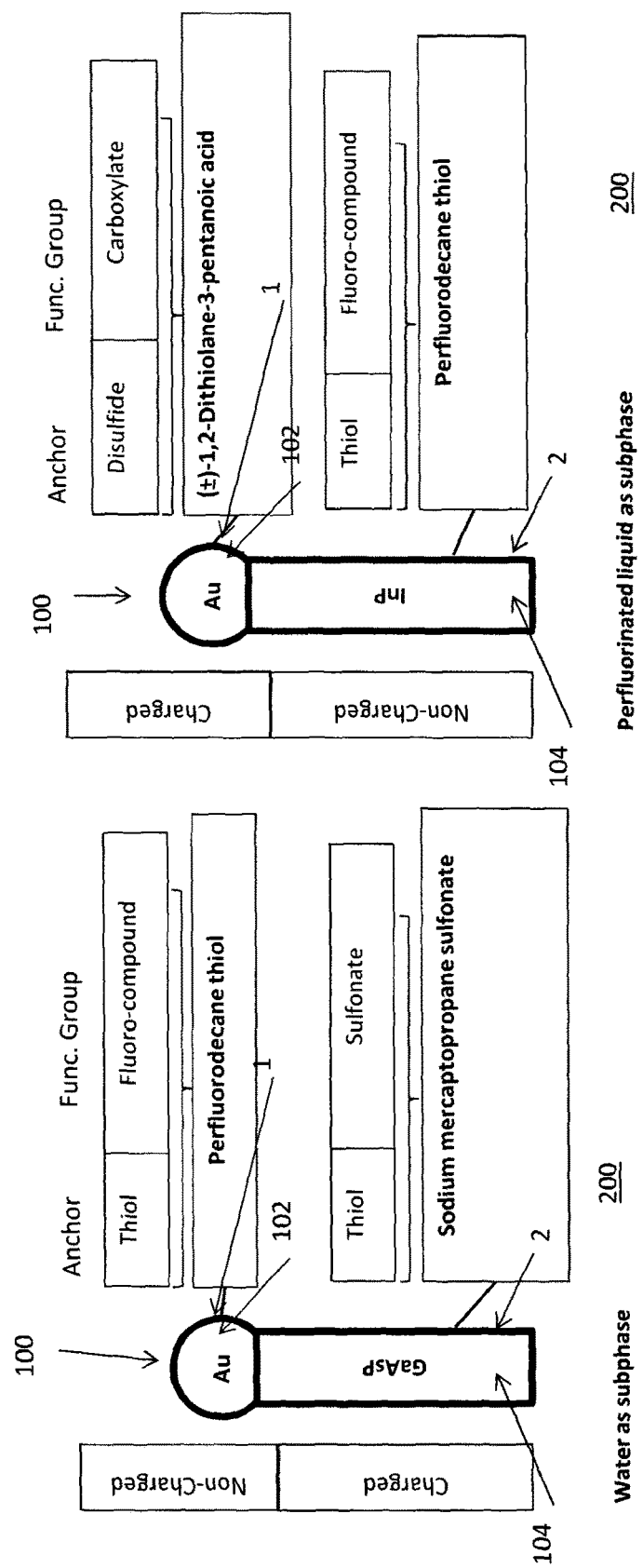
Figure 1L:
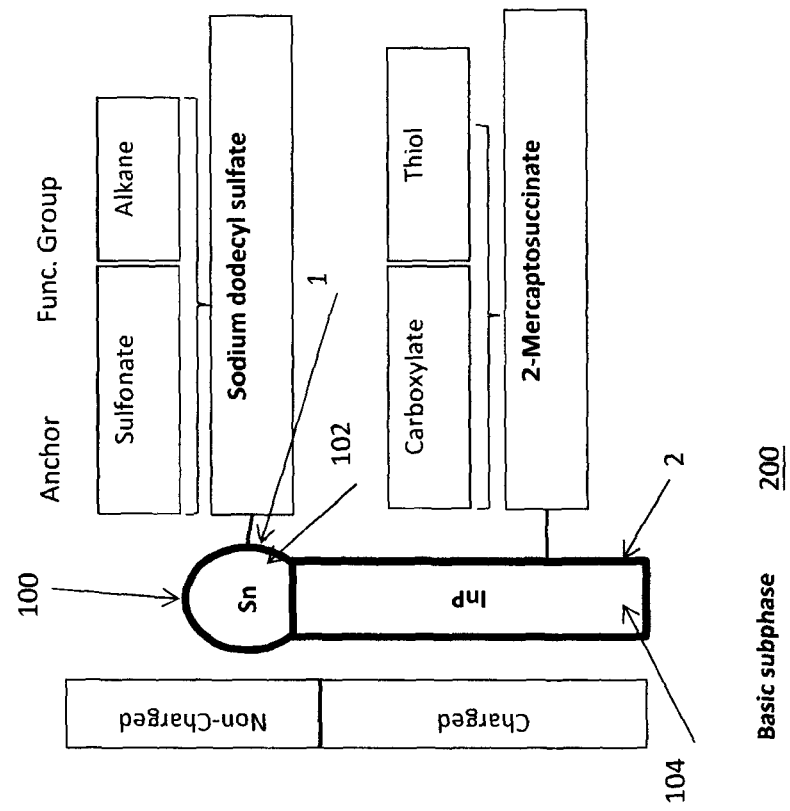
Figure 1M:
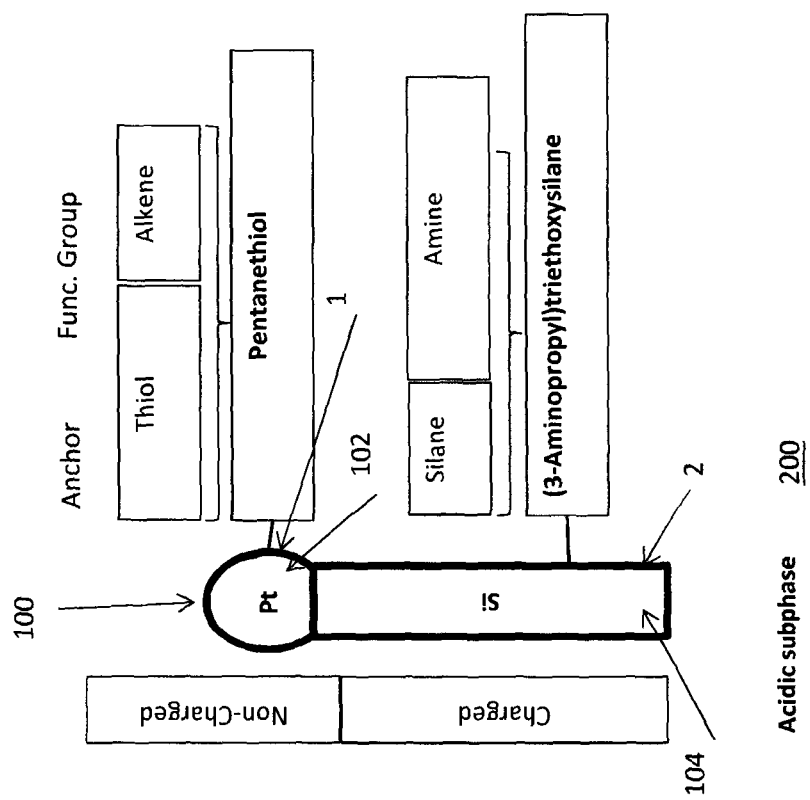

Alternatively, rather than using the LB or LS method to remove the nanowires from the liquid surface, a floating composite film may be used instead. As shown in FIGS. 1F and 1G, a polymer binder matrix material or combination of polymer binder and one or more of filler (e.g., hard nanoparticles), plasticizer and/or compatibilizer is dispensed to the nanowires to form a matrix so that nanowire to nanowire distance can be tuned (i.e., a densification substep). The polymer (or its monomer precursor) 208 may be selected to be immiscible with the liquid, such as water, to float as a composite nanowire-polymer film 210 on the liquid 200 surface 202, as shown in FIG. 1F. The nanowires 100 may protrude through the top or bottom of the composite film 210 (e.g., the semiconductor stem portions 104 of the nanowires may protrude through the bottom surface of the film 210 into the liquid 200).

Alternatively, as shown in FIG. 1G, the polymer or monomer precursor 212 is soluble, forming a surface layer 210A together with the nanowires 100. Optionally, if the binder is a radiation curable polymer, then UV or other radiation (e.g., X-ray, visible radiation, infra-red radiation, etc.) is used to cure polymer binder to form a matrix in place in order to preserve the nanowire alignment, orientation and distances. This forms a composite film containing uniaxially oriented/aligned nanowires (which may be oriented in the same direction) in a polymer matrix which floats on the surface of the liquid, such as water. The composite film may be rigid or flexible (i.e., bendable).

Then, the composite film 210 or 210A containing nanowires 100 embedded in the matrix is removed, unidirectionally aligned and placed on appropriate substrate (e.g., 204 shown in other figures) for further processing. The cured film containing the nanowires in a polymer matrix may be rolled and transferred in roll to roll configuration to the substrate. Alternatively, the cured film may be a rigid, freestanding film which is placed on a carrier substrate and then transferred from the carrier substrate to a device substrate. Alternatively, a frame may be used to constrain the film before curing and then the frame is used to transfer the cured film to the device substrate. If desired, a mechanical supporting layer or layers (e.g., polymer layer) may be formed on one or both sides of the composite film for structural support.

Alternatively, an ink containing the nanowires, the polymer matrix material and a solvent is deposited (e.g., printed) on the surface. The polymer matrix material may be retained in the final device or it may be a sacrificial material which is removed after the nanowires are fixed (e.g., captured) on the substrate surface. The polymer material may be removed by selective etching or by ashing if the polymer material is a photoresist type material used in semiconductor photolithography processing.

Next in step 8, a first ohmic contact is optionally formed between the bound nanowires and the substrate. This contact may be, for example, the lower contact of a solar cell and formed by annealing the device.

In step 9, the nanowires are embedded/encapsulated to provide electrical insulation for further processing. In one aspect of this step, encapsulation is achieved with a sol-gel process. In one aspect, hydrogen silsesquioxane (HSQ) is deposited and heated to produce an oxide embedding (i.e. an interwire filler/shell isolation layer that secures and electrically isolated the nanowires from each other).

In another embodiment described below, the nanowires are encapsulated in a polymer matrix from an ink containing a solvent, nanowires and the polymer matrix material (or its monomer precursor material which is subsequently polymerized) in one or more steps 2, 3, 4 and/or 5 described above. In this embodiment, the nanowire ink containing the polymer matrix and the nanowires in the solvent is transferred to a substrate surface in step 5, followed by removal of the solvent (by heated drying, evaporation, etc.) to leave a film comprising the aligned nanowires embedded in the polymer matrix on the substrate surface. In this embodiment, the separate encapsulation step 9 may be omitted.

In step 10, the top electrical contact is formed. The top contact may be made of a conducting oxide, such as indium tin oxide or a conducting polymer. In another aspect, the top contact is made of a metal such as titanium or tungsten, if the substrate is transparent to solar radiation.

Optionally, a substrate preparation step may be performed before steps 4 or 5. The substrate preparation step may include steps of cleaning and or etching to remove surface dirt/grease and/or etching to remove native surface oxide from the substrate. Optionally a step of drying may be performed after steps 6, 7 and/or 8. Optionally, an etch-back of the encapsulation layer may be performed after step 7. Optionally, the metal catalyst particle portion (e.g. gold), described in more detail below, of the nanowires may be removed after steps 7, 8, 9 or 10.

In summary, FIG. 1A illustrates the following steps ten steps (1-10) some or all of which may be omitted depending on the desired outcome. Furthermore, steps 2 and 5 may have different substeps (a, b or c) depending on intended film or ink composition and structure as follows:
1. Collection
2. Functionalization
  a. For non-aggregation
  b. For alignment and non-aggregation but not unidirectional orientation
  c. For unidirectional orientation, alignment, and non-aggregation
3. Dispersion
  a. For non-aggregation
4. Alignment
  a. Without unidirectional orientation
  b. With unidirectional orientation
5. Deposition
6. Densification
7. Fixation/Capture
8-10. Processing (e.g., bottom contacting, embedding, top contacting).

For example, to form a dense ink (i.e., an ink containing nanowires and other optional solids, such as a polymer matrix, in a solvent) steps 1, 2 and 6 from FIG. 1A are performed. Step 3 may also be optionally performed between steps 2 and 6. To form a dense ink with non-aggregated nanowires, step 2a is performed (i.e., the functionalization is selected to avoid nanowire aggregation). To form a dense ink with non-aggregated nanowires that are or can subsequently be aligned, step 2b is performed (i.e., the functionalization is selected to avoid nanowire aggregation and to facilitate alignment of the nanowires). To form a dense ink with non-aggregated nanowires that are or can subsequently be aligned and oriented (i.e., with the catalyst nanoparticle pointing up or down in all or most of the aligned nanowires), step 2c is performed (i.e., the functionalization is selected to avoid nanowire aggregation and to facilitate alignment and orientation of the nanowires).

To form a solid film containing nanowires and other optional solids, such as a polymer matrix, steps 1, 2, 4 and 7 from FIG. 1A are performed. Step 3 may also be optionally performed between steps 2 and 4. Steps 8, 9 and/or 10 may be optionally performed as desired. If a dense film is desired, then step 6 is also performed. To form a film with non-aggregated nanowires, step 2a is performed (i.e., the functionalization is selected to avoid nanowire aggregation). To form a film with non-aggregated nanowires that are aligned, steps 2b and 4a are performed (i.e., the functionalization and alignment are selected to avoid nanowire aggregation and to facilitate alignment of the nanowires). To form a film with non-aggregated nanowires that are aligned and oriented (i.e., with the catalyst nanoparticle pointing up or down in all or most of the aligned nanowires), steps 2c and 4b are performed (i.e., the functionalization and alignment are selected to avoid nanowire aggregation and to facilitate alignment and orientation of the nanowires).

In an embodiment of the method of making a nanowire device, the nanowires have a first metal particle portion and a second semiconductor portion. The method includes the steps of functionalizing the first portions of the nanowires with a first charged functionalizing compound and optionally functionalizing the second portions of the nanowires with a second non-charged functionalizing compound. Alternatively, the first portions of the nanowires may be functionalized with a first non-charged functionalizing compound and the second portions of the nanowires functionalized with a second charged functionalizing compound. The second functionalizing compound is different from the first functionalizing compound. In another alternative embodiment, the entire nanowire, i.e. both the metal particle portion and the semiconductor portion, are functionalized with functionalizing compound having the same charge. The method also includes dispersing the plurality of nanowires in a solvent, aligning the plurality of nanowires on a substrate or on a liquid surface such that a longitudinal axes of the nanowires are oriented substantially perpendicular to a major surface of the substrate and fixing the plurality of nanowires to the substrate. Any suitable functionalizing compound may be used, such as any suitable ligand. Also, functionalization may be done with a binary system and one treatment step. In other words, both functionalizing compounds may be attached to opposite ends of the nanowire in the same step from a binary liquid phase containing both compounds.

A charged functionalizing compound may be defined as a compound that makes the functionalized surface less hydrophobic than hydrophilic, while a non-charged functionalizing compound may be defined as a compound that makes the functionalized surface more hydrophobic than hydrophilic. In another embodiment, both the functionalizing compounds are non-charged, but one is fluorinated (i.e., not lipophilic)

and the other one is not fluorinated (i.e., lipophilic). Together, these compounds induce an environment where the nanowire portion or surface treated with a fluorinated compound becomes less hydrophobic than the other nanowire portion or surface, and the fluorinated compound can thus be referred to as a charged functionalizing compound.

A functionalizing compound comprises a surface affixing moiety (called "anchor") and further comprises a functional group that gives the compound its specific properties. Table I lists different kinds of anchor groups as well as different kinds of functional groups. Some non-limiting, exemplary combinations of anchors and functional groups are shown in the examples column. The fluorinated compounds mentioned above are shown in italic font. Exemplary solvents are also listed in the last row of Table 1.

this embodiment, the nanowire 100 has a metal particle (e.g. a growth catalyst) portion 102, such as gold, silver, copper, gallium, aluminum, platinum or an alloy thereof, and a semiconductor portion 104. The semiconductor portion 104 may be made of Group III-V, II-VI and IV semiconductor materials, such as GaAs, InP, InAs, $GaAs_xP_{1-x}$, $In_xGa_{1-x}P$, InGaAsP, InGaAsSb, GaN, InN, $Ga_xIn_{1-x}N$, GaP, InSb, GaSb, $In_xAl_{1-x}Sb$ $Ga_xAl_{1-x}Sb$, AlN, BN Si and SiC.

In a first step, a sacrificial layer 106, such as an oxide, is selectively formed over the semiconductor portion 104 of the nanowire 100. That is the sacrificial layer is formed over the semiconductor portion 104 of the nanowire 100 but not on the metal particle portion 102 of the nanowire 100. The sacrificial layer 106 may be formed by an active step (e.g. forming an oxide by heating in an atmosphere containing oxygen) or spontaneously formed as in the case of the

TABLE I

Functionalizing Compounds

| Definition | "Anchor" | Functional Group | Examples |
|---|---|---|---|
| Charged Surface less hydrophobic than hydrophilic | thiol, carboxylic acid, phosphonic acid, disulfide, silane, sulfonate, phosphine | sulfonate, phosphonate, carboxylate, amine, polyether | sodium mercaptopropane sulfonate, sodium mercaptoethane sulfonate, mercaptoalcane succinate (2-mercaptosuccinate), 12-mercaptododecanoic acid (MDA), (11-mercaptoundecyl)-N,N,N-trimethylammonium bromide, (12-Phosphonododecyl)phosphonic acid, (±)-1,2-Dithiolane-3-pentanoic acid (also known as lipoic acid), (2-ammonioethyl)di-tert-butylphosphonium bis(tetrafluoroborate), (3-aminopropyl)triethoxysilane, 12-mercaptododecanoic acid NHS ester |
| Non-charged Surface more hydrophobic than hydrophilic | thiol, carboxylic acid, phosphonic acid, disulfide, silane, sulfonate, phosphine | alkane, alkene, alkyne, fluoro-compound | pentanethiol, *perfluorodecane thiol*, dodecyltrichloro silane, stearic acid, decyl phosphonic acid, triphenyl phosphine, octadecanethiol, 5-(1,2-dithiolan-3-dodecylpentanamide, sodium dodecyl sulfate |
| | Solvents | | methyl isobutylketone, methyl isopropylketone, acetonitrile, diethyl ether, butanol, hexanol, ethanol, cyclopentanone, butyl acetate, chloroform, dichloromethane, *perfluoropolyether (PFPE)*, water |

In Table I above, any suitable combination of solvent, charged functionalizing compound and non-charged functionalizing compound may be used. Furthermore, any suitable anchor and functional group combination may be used in the charged or non-charged compounds in addition to the exemplary compounds listed in Table I. FIGS. 1H through 1O illustrate, non-limiting examples of combinations of nanowire catalyst particle 102 materials, nanowire semiconductor stem portion 104 materials, anchors and functional groups of the functionalizing compounds (e.g., ligands 1 and 2), functionalizing compounds, and liquid subphase 200 compositions. These figures also indicate whether the liquid subphase 200 is preferably acidic (e.g., pH<7, such as 2-6), basic (e.g., pH>7, such as 8-12) or fluorinated. The pH of the liquid subphase made assist in the alignment of the nanowires 100 on the subphase 200 surface 202.

Figure 2:
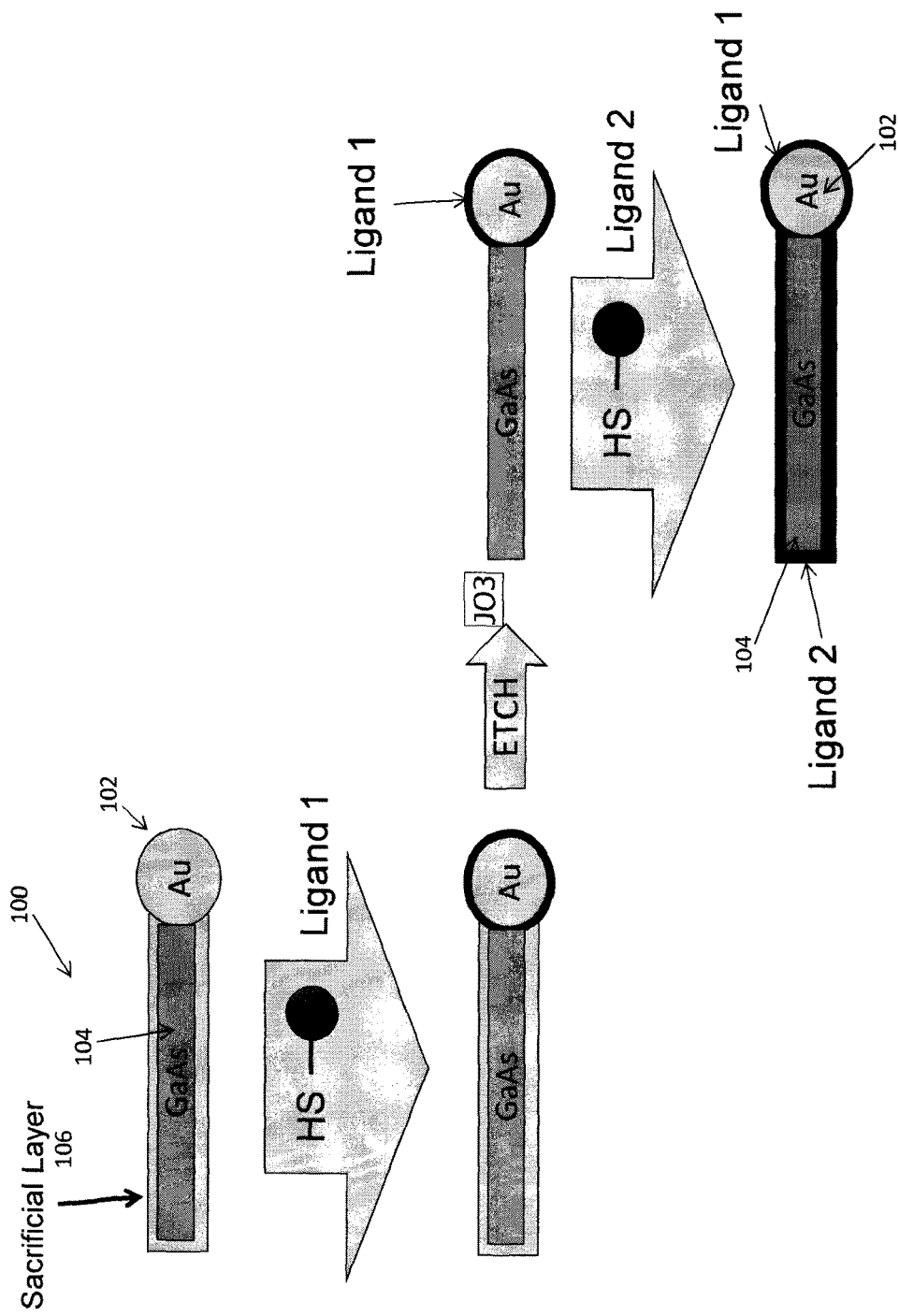
FIG. 2 is a flow diagram illustrating a method of nanowire differentiated functionalization according to an embodiment.

FIG. 2 illustrates a method of functionalizing a nanowire according to an embodiment of step 2 shown in FIG. 1A. In formation of a native oxide. The sacrificial layer 106 may be formed by wet or dry oxidation of the semiconductor portion 104. In case where the particle portion 102 is a noble metal, it does not oxidize, such that the sacrificial layer 106 is only formed on the semiconductor portion 104 and not the metal particle portion 102. Then, a first ligand 1 is affixed to the metal particle portion 102 of the nanowire 100. The first ligand 1 may be selected so that it preferentially bonds to the metal particle portion 102 of the nanowire 100. However, this is not necessary. The method described above can be extended to apply for non-noble metals and quasi-metallic surfaces achievable on some semiconductor facets, as such of (111) type for many III-V semiconductors. Such surfaces are prone to oxidize in air, so an additional removal step, usually through wet etch, may be applied.

In the next step, the sacrificial layer 106 is removed from the semiconductor portion 104 of the nanowire 100. For example, the nanowire 100 may be selectively etched with ammonia, which removes the native oxide 106 from the semiconductor portion 104, but not the first ligand 1, e.g. a thiol on Au catalyst particle 102. Other etchants may be used depending on the semiconductor material to be selectively etched, such as HF or KOH to remove silicon oxide from silicon, such as HCl to remove indium oxide from InP. Any first ligand 1 affixed to the sacrificial layer 106 is thereby removed but the first ligand 1 attached to particle 102 remains. Next, the nanowire 100 is optionally exposed to a second non-charged (or charged) ligand 2 which preferentially bonds to the semiconductor portion 104 of the nanowire 100. In this manner, the nanowire is double functionalized. If desired, ligand 2 may be identical to ligand 1 or it may be omitted.

The ligands 1, 2 may he attached, for example, by immersing or dipping the nanowires in solutions that include the ligands such that the ligands adsorb physically or chemically, such as forming covalent bonds with the nanowire 100. Another suitable sacrificial material 106 besides a semiconductor oxide may be used which can be selectively removed without removing the first ligand 1 attached to the nanowire portion 102.

By using two different ligands (i.e., functionalizing compounds), collective manipulation of nanowires (NWs) may be performed such that vertical orientation and dense lateral packing may be achieved. The NWs may be functionalized so that the Au "head" (e.g. metal catalyst particle 106) behaves differently than the semiconductor "tail" 104 in an external field and/or at an interface. In other words, the ligand/surfactant 1 that is used to cover metal particle portion 102 confers different properties (electrical charge, hydrophilicity, etc.) than the ligand/surfactant 2 covering semiconductor portion 104. NWs functionalized in this way may then be oriented in the desired way either by utilization of an external field (primarily an E-field), or at an asymmetric interface (e.g., using Langmuir-Blodgett and Langmuir-Schaefer techniques).

In an embodiment, a charged ligand 1, such as a charged surfactant is bonded to the metal particle portion 102 of the nanowire 100 and a non-charged ligand 2 such as a non-charged surfactant is bonded to the semiconductor portion 104. In an embodiment, the charged surfactant is sodium mercapto propane sulfonate (SMPS) or MDA (mercaptododecanoic acid). In an embodiment, the non-charged surfactant is octadecylthiol (ODT) or pentanethiol (PeT). In an alternative embodiment, a non-charged surfactant is bonded to the metal particle portion 102 of the nanowire and a charged surfactant is bonded to the semiconductor tail 104.

Vertically aligned nanowires may be used advantageously in solar cell devices. The semiconductor portion 140 of the nanowire 100 may have one or more axial or radial p-n or p-i-n junctions. Other devices that can be made by the embodiments disclosed above (and below) include nanowire light emitting diodes (LEDs), textured electrodes and sensors. Other semiconductor devices that may be fabricated include memory devices and lab-on-chip devices.

Another embodiment relates to a method of production of aggregation-free suspensions, or dispersions, of semiconductor nanowires (NWs) in a solvent which corresponds to step 3 in FIG. 1A. Such a suspension or dispersion may be denoted as an "ink". "Aggregation-free" includes those suspensions in which (1) the vast majority of NWs are dispersed in the ink in such a way that they have no permanent contact with other NWs while suspended in the solvent; (2) the sediment that forms when the NWs are allowed to settle is easily re-dispersible, so that a dispersion with the properties described in (1) is (re) formed; and (3) if deposited and dried on a solid substrate in the absence of an external field (e.g. a perturbation instead of field), the NWs are distributed as single, stochastically distributed, non-aggregated particles. The nanowires may be dispersed in gas, liquid, or supercritical fluid systems. Further dispersion may be accomplished in polar and semi-polar solvents, such as water (polar solvent) and MIBK (semi-polar solvent). Dispersion may include electrostatic stabilization and/or steric stabilization.

According to an embodiment, aggregation-free inks can be prepared using (a) a charged ligand (e.g. a surfactant containing a thiol functionality, such as sodium mercaptopropane-sulfonate, SMPS, or another functionalizing compound, such as MDA or other compounds in Table I) that binds to the nanowire in combination with (b) a semi-polar solvent (e.g. methylisobutylketone, MIBK) or a polar solvent, such as water (or other solvents listed in Table I). Polar solvents will dissolve ionic and other polar molecules (i.e. those with an asymmetric charge distribution (like dissolves like), whereas, non-polar solvents will dissolve non-polar molecules. Semi-polar solvents (e.g. alcohols and ketones) can dissolve both polar and non-polar molecules.

In another embodiment, in case of non-polar nanowire functionalization, the nanowires may be dispersed in a non polar solvent. In this embodiment, PEGylation may be used to prevent nanowire aggregation.

In a non-limiting embodiment, the ligands (i.e., functionalization compounds) may also be classified in terms of electric charge. Ligands may be either neutral (L) or electrically charged (e.g., ionized) (X). If the ligand in its free state (unbound but in solution) is neutral (i.e. not electrically charged), then the ligand is classified as neutral (L). If the ligand in its free state carries an electrical charge, it is electrically charged (X). Electrically charged ligands may be either positively or negatively electrically charged, depending on whether they form a cation or anion in solution.

Embodiments may be used for production of inks containing nanowires, intended for controlled deposition on a substrate. Embodiments also include use of such inks in deposition and alignment (preferably vertically) of nanowires on solid substrates. One embodiment is drawn to the integration of semiconductor nanowires in a solar panel. Further embodiments include other semiconductor devices, e.g., light emitting diode panels. Other embodiments include any technology field which may use well-dispersed nanowires, for instance lithographic applications. Still other embodiments are drawn to tools for safe and hassle-free harvesting, handling and transport of nanowires in bulk (as a concentrated "ink", rather than as a hazardous, dusty dry material). Embodiments may also be used for processing nanowires other than semiconductors, e.g., metals, insulators, carbon nanotubes, elongated biological/organic structures, etc.

The inventors have discovered that using a charged ligand, such as a surfactant (e.g. sodium 3-mercapto-propane-1-sulfonate, SMPS, MDA (12-mercaptododecanoic acid), etc.) effectively inhibits aggregation of nanowires, thus making it possible to manipulate the nanowires in the dispersed state. Furthermore, the inventors surprisingly found that a polar or semi-polar solvent, such as methylisobutylketone (MIBK) or other solvents listed in Table I, is in its own right effective as an inhibitor of aggregation.

Figure 3:
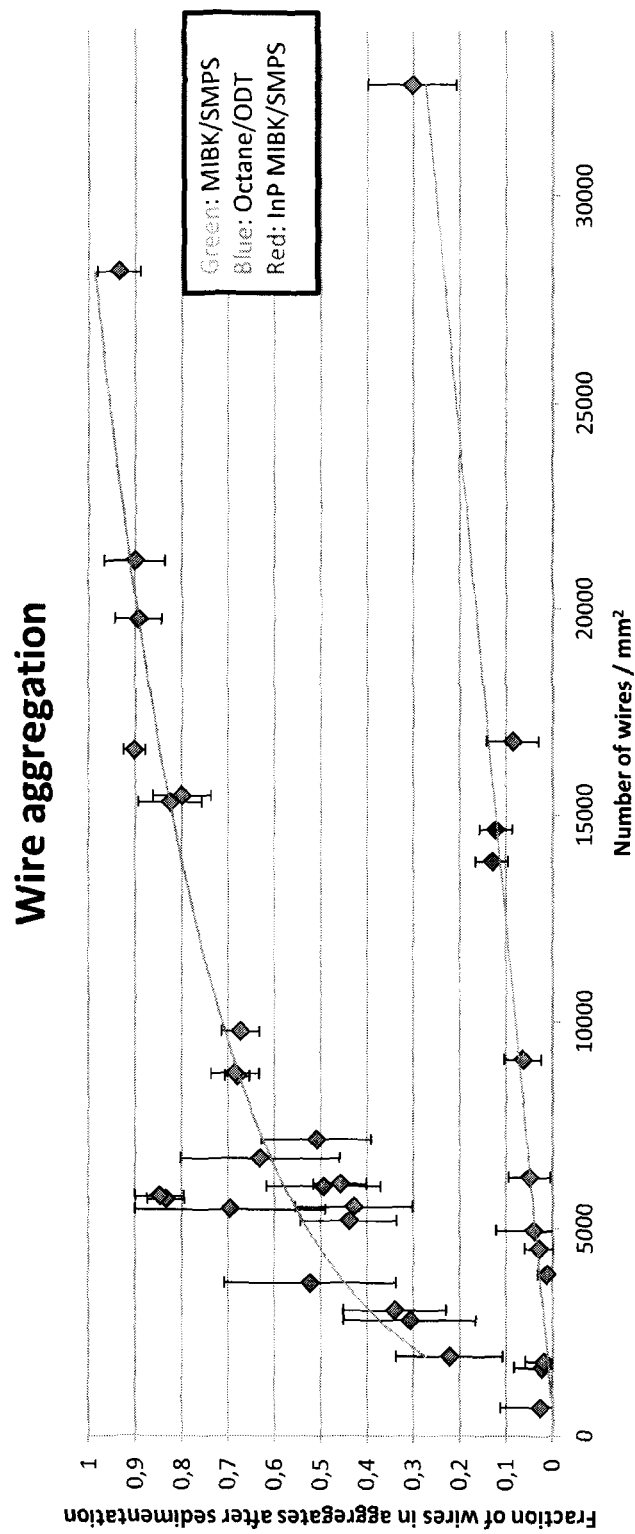
FIG. 3 is a plot comparing the fraction of wires in aggregates as a function of the number of wires in several embodiments of the invention.

FIG. 3 is a plot that compares the fraction of nanowires in aggregates as a function of the number of wires for several embodiments of the invention. As can be seen in the figure, the combination of a charged ligand (SMPS) and a semi-polar solvent (MIBK) yields much less aggregation of GaAs and InP nanowires than the combination of a non-charged ligand (ODT) and a non-polar solvent (octane) for GaAs nanowires.

Figure 4:
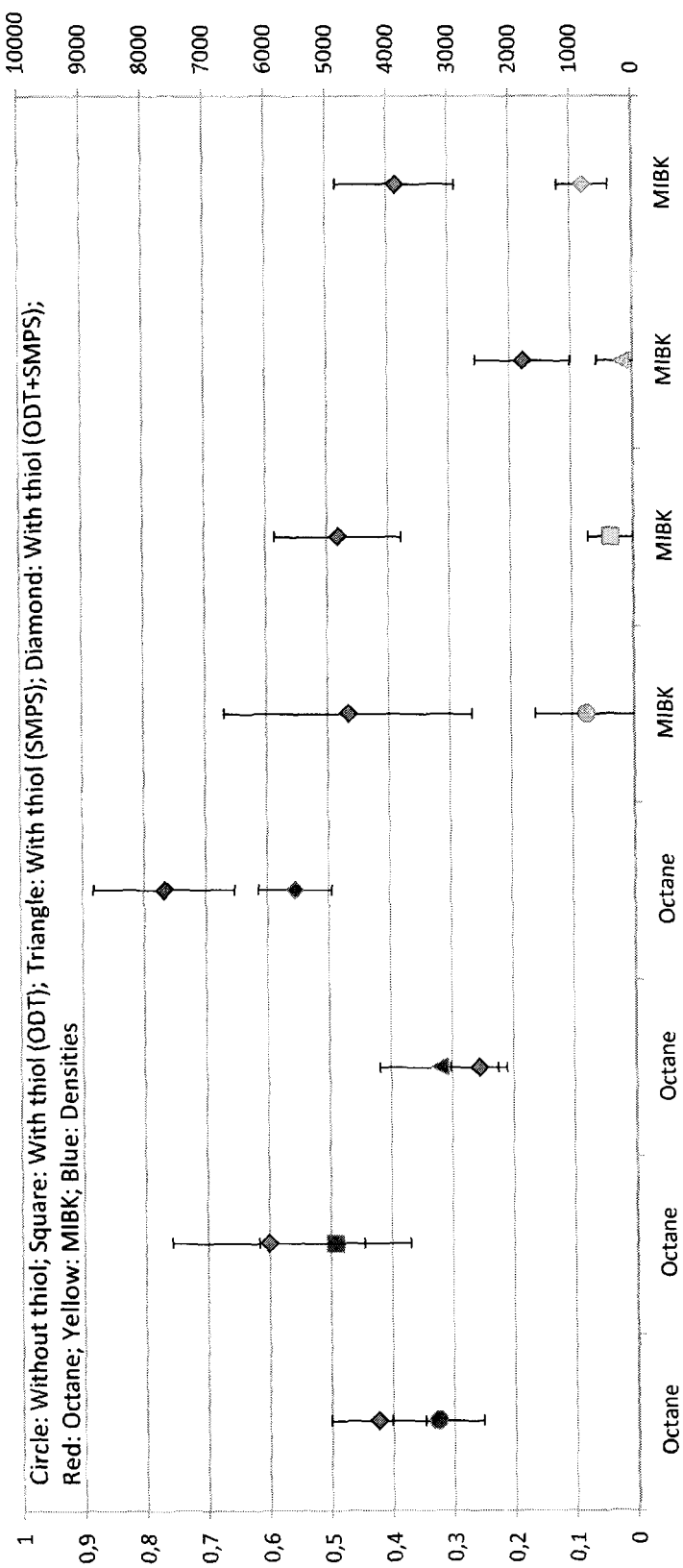
FIG. 4 is a plot comparing the aggregation ratio and wire density of several embodiments.

FIG. 4 is a plot comparing the aggregation ratio and wire density of several embodiments. As can be seen in the figure, use of the semi-polar solvent MIBK results in a lower aggregation ratio and lower wire densities than the use of the non-polar solvent octane. The presence or absence of a charged thiol SMPS I on the nanowire portion 102 has a smaller effect on decreasing the aggregation ratio in octane and MIBK (it possible that a density effect instead of or in addition to the surface treatment may be responsible in case of octane).

FIGS. 5A-5C illustrate the aggregation free deposition of an embodiment. As can be seen in the SEM micrograph (FIG. 5A) and the two optical micrographs (FIGS. 5b, 5C), aggregation free nanowires (e.g. GaAs nanowires) can be deposited on a substrate with the proper selection of charged ligand and polar or semi-polar solvent (e.g. SMPS and MIBK). The choice of solvent has a greater impact on aggregation inhibition than the presence/absence of charged or uncharged ligands.

FIGS. 6A-6C illustrate the aggregation of nanowires deposited in a comparative example with no or poor surface treatment. As can be seen in the SEM micrograph (FIG. 6B) and the two optical micrographs (FIGS. 6A, 6C), deposition of GaAs nanowires with only non-charged ODT ligand and non-polar octane solvent results in aggregation of the nanowires on the substrate surface.

FIGS. 7A-7B are SEM micrographs illustrating "chaining" of GaAs nanowires functionalized with ODT in octane while FIGS. 7C-7D are SEM micrographs illustrating the lack of agglomeration and chaining of nanowires functionalized with SMPS in MIBK. As can been seen in FIGS. 7A and 7B, nanowires may aggregate by lining up/bonding end to end, forming long chains of nanowires. However, the nanowires can be deposited without aggregation in a semi-polar solvent (FIGS. 7C and 7D).

While SMPS is described above as the charged ligand 1, any other suitable charged ligand may be used, such as those listed in Table I. For example, an anionic ligand may be used. The anionic group can, for instance, be sulfonate (as in SMPS), phosphonate or carboxylate. The counter-ion can be any cation, such as a metal ion (sodium as in SMPS, potassium, calcium, etc.), or an ammonium derivative. The linker between the thiol and the anionic group can be a straight alkyl chain of any length (e.g. propyl as in SMPS), or another suitable organic group as long as it is not excessively bulky. Other examples of anionic ligands include sodium mercaptopropane sulfonate, sodium mercaptoethane sulfonate, and mercaptoalkane succiante (2-mercaptosuccinate).

In another example, a cationic ligand may be used. The cationic group can be an amine (primary, secondary or tertiary; the latter being the preferred in order to avoid problems with deprotonation and concomitant loss of charge density). The linker between the thiol and the cationic group can be a straight alkyl chain of any length (e.g. propyl), or another suitable organic group as long as it is not excessively bulky. The counter-ion can, for instance, be a halide (chloride, bromide) or a carboxylate. An example of a cationic linkers include mercaptoalkane amines, such as (11-mercaptoundecyl)-N,N,N-trimethylammonium bromide).

Thus, as shown in Table I, the first ligand 1 may be bifunctional. That is, the first ligand may comprise first thiol moiety (e.g. the anchor) and a second charged moiety (e.g., the functional group), such as a sulfonate, phosphonate, carboxylate, or amine, for example, sodium mercaptopropane sulfonate, sodium mercaptoethane sulfonate, or mercaptoalcane succinate (2-mercaptosuccinate), 12-mercaptododecanoic acid, or (11-mercaptoundecyl)-N, N,N-trimethylammonium bromide. The second ligand 2 may comprise any suitable non-charged ligand, as an alkyl- or aryl-thiol, for instance octadecylthiol. Alternatively, ligand 1 may be non-charged and ligand 2 may be charged. The solvent may comprise any suitable polar or semi-polar solvent, such as methylisobutylketone, methyl isopropylketone, acetonitrile, diethyl ether, an alcohol (e.g., butanol, hexanol, etc.) or combinations thereof.

Figure 8:
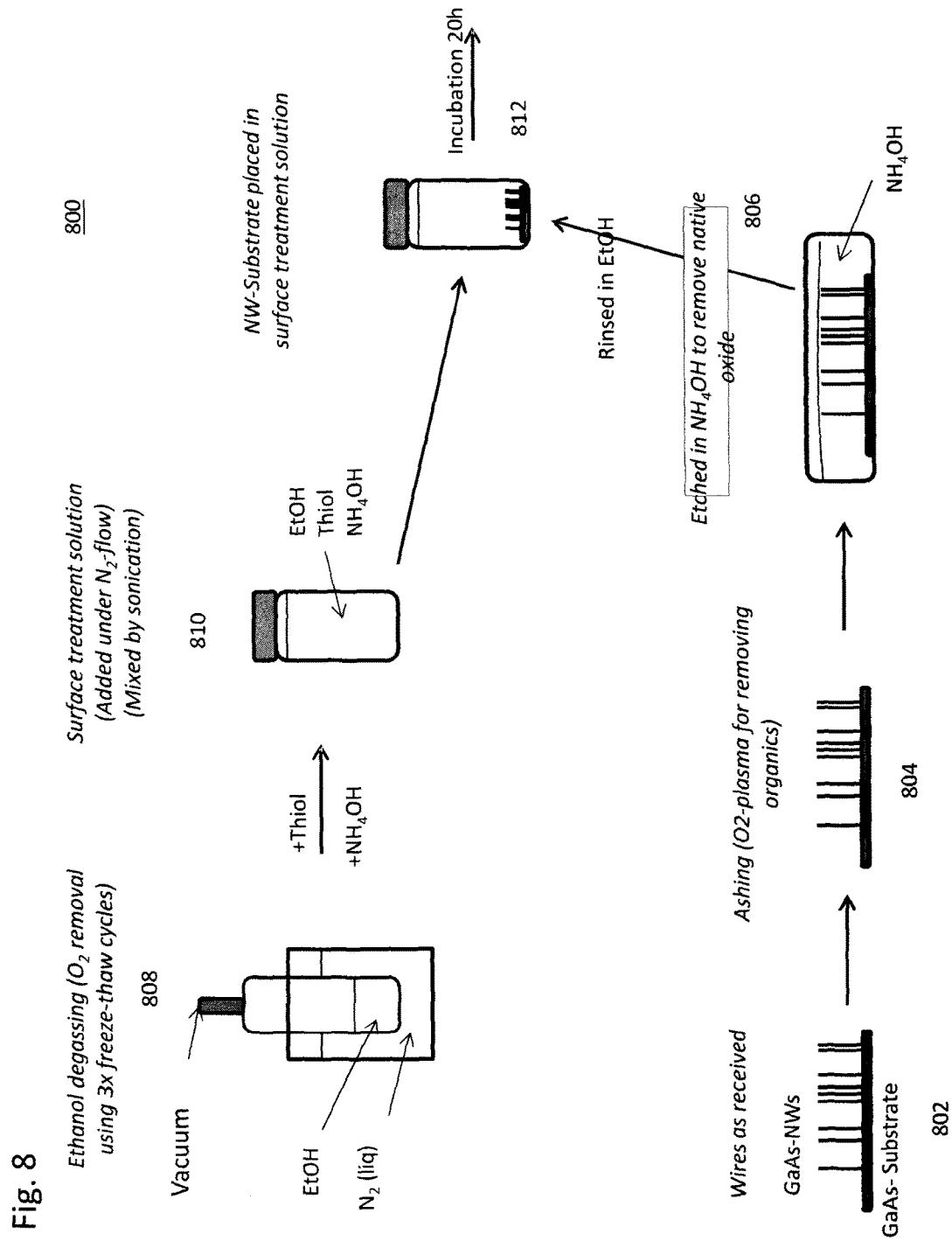
FIG. 8 is a flow diagram illustrating an embodiment of a method of surface treating nanowires.
Figure 8:
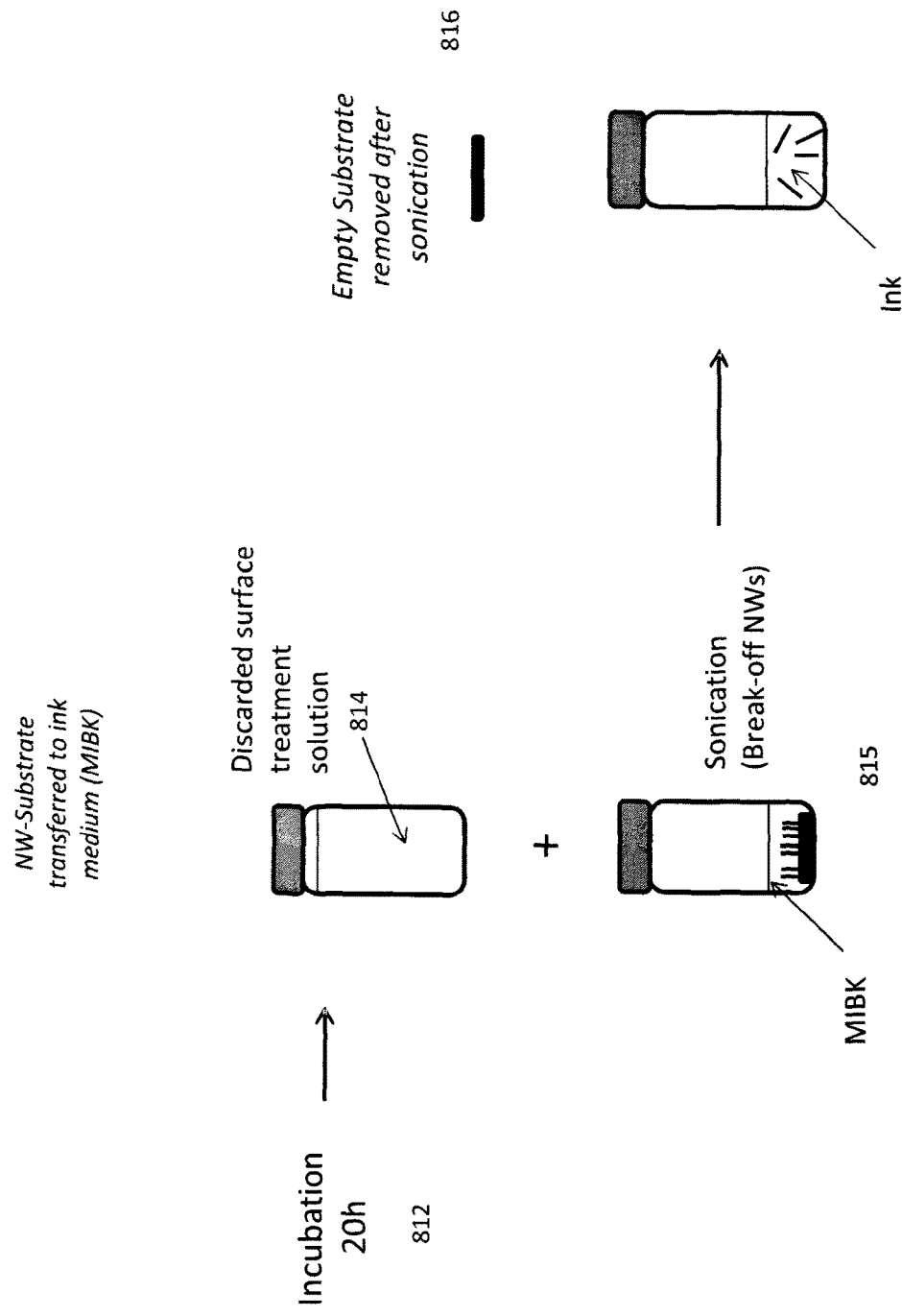

FIG. 8 is a flow diagram illustrating an alternative embodiment of a method 800 of surface treating nanowires. A comparable surface treatment is described in an article by McGuiness et al J. AM. CHEM. SOC. 2006, 128, 5231-5243. This embodiment is preferably used for substrate grown nanowires (rather than for Aerotaxy™ grown nanowires), electric field alignment and a single functionalization.

In a first step in this embodiment, nanowires are received, step 802. The nanowires may be attached to a substrate or loosely packed in a container (e.g. formed by Aerotaxy™ in an optional solvent). Next, the nanowires may be exposed to an oxygen plasma in an ashing process to remove organics, step 804. The nanowires may then be etched, e.g. in $NH_4OH$ for GaAs, to remove any native oxide, step 806. As discussed above, other etchants may be used for different semiconductor materials. Prior, concurrently or subsequently to these steps, a surface treatment solution may be prepared by first degassing a solvent, step 808, such as removing oxygen from ethanol, by multiple (e.g. 3) freeze-thaw cycles. Next, the surface treatment compounds are added to the solvent, step 810, such as adding a thiol compound and $NH_4OH$ (e.g., 10 micro liters) to the ethanol solvent (e.g., 15 ml) followed by mixing (e.g., by sonication or other suitable methods). The surface treatment compound may be added under a nitrogen flow and the solution mixed by sonication. In the next step, the nanowires are cleaned in ethanol and then added to the surface treatment solution and incubated, such as incubation for 2-24 hours, such as 12-20 hours, step 812. In this step, the surface nanowires may be functionalized, such as to have zwitterionic charge distribution or be amphiphilic. Then, the nanowires are separated from the surface treatment solution, step 814. Next, the nanowires may be added to a semi-polar or polar solvent, such as MIBK (which is preferred for electric field alignment), or another solvent, such as chloroform, dichloromethane, or butyl acetate (which are preferred for the LS or LB type alignment/deposition), to form an ink, step 815. Alternatively, the nanowires may be added to a gas-liquid interface to form a Langmuir-Blodgett (LB) film (followed by transfer of the LB film to a solid substrate), a liquid-liquid system comprising two immiscible liquids to form an emulsion or a gas-solid to form an aerosol. If the nanowires are still attached to a substrate, the nanowires may be separated from the substrate in this step, such as by sonification or by freezing in liquid nitrogen. The substrate may then be removed, step 816.

FIGS. 9A-9C are schematic illustrations of steps in a method of attaching nanowires to a substrate according to an embodiment, which corresponds to step 7 in FIG. 1A. In the step shown in FIG. 9A, an organic attachment ligand 900 is bonded to the nanowire 100. Any suitable attachment ligand, such as 12-mercaptododecanoic acid NHS ester, may be used. In the embodiment illustrated in FIG. 9, the organic attachment ligand 900 is bound to the metal particle portion 102 of the nanowire 100. Alternatively, the organic attachment ligand 900 may be bound to the semiconductor portion 104 of the nanowire 100. Also illustrated is the first ligand 1 (e.g., SMPS discussed above) attached to the nanowire 100. Preferably, but not necessarily, ligand 1 does not participate in forming the covalent bond to the substrate.

A substrate 902 is provided separately in the step shown in FIG. 9B. The substrate 902 may comprise any suitable material, such as semiconductor (e.g., Si or GaAs wafer), metal, plastic, ceramic, quartz, glass, etc. and the substrate may be transparent or non-transparent to visible light. In an embodiment, the substrate 902 is provided with an attachment layer 904, such as a metal layer, such a layer of gold, silver, platinum or alloys thereof. A second attachment ligand 906 is bound to the substrate 902 or attachment layer 904. Any suitable attachment ligand, such as 6-amino-1-hexanethiol, may be used.

The first attachment ligand 900 and the second attachment ligand 906 are selected so that these ligands 900, 906 form a binding pair 908, typically by forming a covalent bond. That is, the first attachment ligand 900 binds to the second attachment ligand 906. In this manner, the nanowire 100 can be bound to the substrate 902/attachment layer 904, using any suitable bonding method. For example, any suitable ligands 900, 906 and bonding method known in the art, such as those described in the following articles may be used: C. M. Niemeyer et al, Angew. Chem. Int. Ed. 2008, 47, 9618; M. Frasconi et al, Anal. Bioanal. Chem. 2010, 398, 1545.

The embodiments of the present invention provide nanowires that have different chemical composition at the surface in the different ends, or sides, of the nanowire. For example, they could be labeled in one of the ends by a metal particle. The different chemical composition at the surfaces in the ends breaks the symmetry of the nanowire increasing the number of possible states (and phases) for the whole nanowire ensemble.

For example, in a nematic phase rod like objects are ordered with the main axis oriented along a preferred direction. Using nanowires of the embodiments of the present invention to form a nematic phase, and taking the metal particle labeling as one example, the metal particles could be in one direction ("uni-directional up") or the other direction ("uni-directional down") or the metal particles could be randomly arranged (both up and down). Thus, there are at least three possible states (or phases) of axially aligned nanowires in a nematic phase, using the nanowires of the embodiments of the present invention. The same type of arrangements exist for nanowires in the embodiments of the present invention when aligned perpendicular to a surface in a layer. The embodiments of the present invention provide a method to obtain uni-directional alignment of "free" nanowires in one layer, perpendicular to the supporting surface. The uni-directionally oriented nanowires may also be embedded into a film retaining their uni-directional orientation.

In general, nanoparticles should be stabilized to prevent the formation of clusters or aggregates to achieve an industrially useful dispersion or ink of nanoparticles. This applies to both spherical and rodlike particles to be able to handle the dispersions in subsequent processing steps. It is well known that a poorly stabilized dispersion of rods could either form a compact, non-redispersible sediment or a very loosely aggregated, low density, gel-like structure.

Figure 10B:
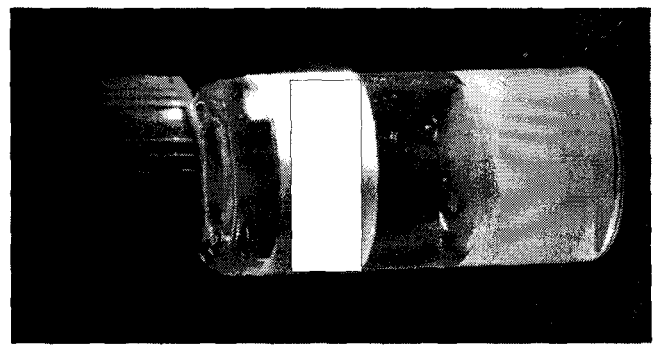
FIGS. 10A and 10B are photographs of nanowires in an organic solvent after storage at least 3 days before and after shaking, respectively. The nanowire concentration is about $1*10^9$ NW/ml or 0.1 mg/ml.
Figure 10A:
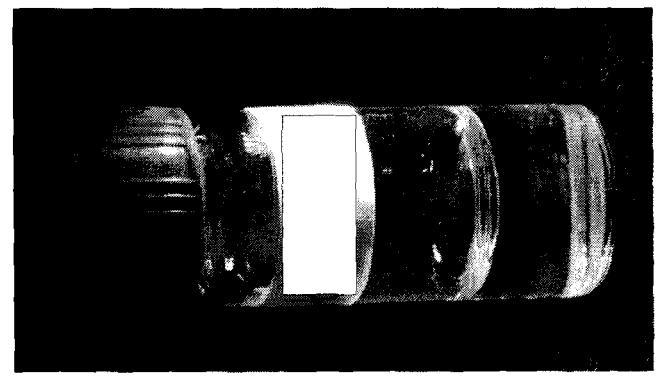

FIGS. 10A and 10B illustrate that the embodiments of the present invention provide sufficiently stabilized dispersions of nanowires is the presence of a redispersible sediment in a solvent, such as an organic solvent. The dispersion in FIGS. 10A and 10B has retained its redispersibility over at least 2 weeks. Other embodiment dispersions exhibited redispersibility of this type over more than one month. The stable nanowire dispersions have a concentration of up to $10^{13}$ NW/ml (e.g., $0.5*10^9$ NW/ml to $1*10^{13}$ NW/ml, for example $1.3*10^9$ NW/ml corresponding to a weight concentration of 0.12 mg/ml), using GaAs nanowires having a density of 5.9 g/cm$^3$. Another evidence of sufficient stability is the low clustering ratio observed in the SEM micrograph shown in FIGS. 5A, 7C, 7D and 11.

Increasing the concentration in a dispersion of rodlike objects, a spontaneous ordering will occur at a certain volume fraction of rods depending on the axial ratio. Above this concentration a nematic phase will appear if the system of rods is able to reach equilibrium. If the system is not able to reach equilibrium, for example due to rapid sedimentation or transport in an electric field, the upper limit will be the random close packing of rods. The random close packing usually occurs at a slightly higher concentration of rods than the nematic ordering. For nanowires with an axial ratio of 20, the concentration where the nematic phase first can be formed is estimated to be around $1.05*10^{13}$NW/ml, corresponding to a weight fraction of 970 mg/ml, using GaAs nanowires. The random close packing of rods occurs at a concentration of $1.85*10^{13}$ to $2.48*10^{13}$NW/ml, corresponding to a weight fraction of 1700-2300 mg/ml, depending on the axial ratio in the range of 15-25, and using GaAs nanowires.

The most suitable nanowire concentration to use in an ink or dispersion will depend on many parameters of the coating (e.g., printing) process, such for example type of equipment, scale, line speed, materials, solvents, etc. Preferably, the concentration of nanowires should be as high as possible without inducing aggregation or clustering (e.g., crystallization). Entering into the nematic concentration regime is preferably avoided since this will introduce a spontaneous ordering in the ink which may interfere with the ordering process during printing. In all cases, the random close packing limit should not be exceeded since this risk of creating a heavily entangled (e.g., crystallized) system that may take too long time to equilibrate in the printing process. Thus, the nanowire concentration in the ink or dispersion is preferably below $1*10^{13}$ NW/ml, such as $0.5*10$ NW/ml to $5*10^{12}$ NW/ml, for example $1*10^9$ NW/ml to $1*10^{12}$ NW/ml In another embodiment, the nanowires are located in a matrix material, such as a polymer matrix in the ink and/or in the film on the substrate. This means that the solid content (what is left of the ink when the solvent has evaporated) not only contains nanowires but also one or more other substances, such as matrix material (e.g., polymer binder material, compatibilizer (e.g., dispersing agent), filler and/or plastisizer), for coating (e.g., printing), casting, lamination or other deposition processes. Some non-limiting examples of each of these components are listed below.

Non-Limiting Examples of Polymer Binder Matrix Material

Any suitable polymer matrix materials, such as binder or encapsulation materials may be used. The polymer backbone could be of any of the following types of polymers: polyacrylates, polyesters, polyamides, polysiloxanes, polyethers, polysaccharides, or consist of combinations thereof. The polymers could also contain monomers carrying a negative or positive charge, hydrophilic uncharged monomers, or hydrophobic groups. The charged groups could be fully dissociated or titrating in aqueous solutions. The hydrophilic uncharged monomers could consist of for example polyoxyethylene side chains or polysaccharides. The hydrophobic side chains for example could consist of methyl-, ethyl- or propyl pendant side chains. The monomers could also contain UV-curable groups, like for example carbon-carbon double bonds. A non-limiting list of examples of polymers of the above types is provided below.

A. Polymers with charge carrying monomers:
   Cationic Guar
   Cationic hyroxyethylcellulose
   Poly(acrylamide-co-diallyldimethylammonium chloride)
   Poly(methacrylamidopropyltrimethylammonium chloride) (polyMAPTAC)
   Poly(ethylene imine)(PEI)
   Chitosan
   Polyacrylic acid
   Carboxymethyl cellulose (CMC, for example Natrosol)
   Hylauronic acid B. Polymers containing hydrophilic, noncharged monomers:
   Hydroxyethylcellulose
   Hemicellulose
   Glucomannan
   Galactomannans C. Polymers containing hydrophobic monomers:
   Nylon
   Hydroxypropylemethylcellulose
   Polymethylmethacrylate copolymers
   Nitrocellulose
   Ethyl cellulose
   Polyvinylacetate
   Polyvinylalcohol, polyvinylacetate block co-polymer
   Polydimethylsiloxane D. Polymers containing UV-curable monomers:
   mr-UVCur06 from Microresist Technology.
   Polyester acrylates (for example EBECRYL polymers from Cytec).

Non-Limiting Examples of Compatibilizer (e.g., Dispersing Agent):
The compatibilizer may comprise any suitable dispersing agent, such as surfactants and solvents:

A. Low molecular weight surfactants, for example: SDS, CTAB, DOTAB, C12E5, C14E7, Zonyl® FSN;
B. Higher molecular weight/block co-polymer surfactants, for example (poly(propylene oxide)poly(ethylene oxide) block co-polymers (Pluronics);
C. Organic solvents, for example alkanes (such as heptane, octane, dodecane), and non-volatile alcohols, such as alkanols (decanol, hexadecanol) phenols (nonylphenol) or polyols (TMP, Dipentaerythritol);
D. Lipids and their derivatives, for example stearic acid, phosphatidylcholine, glycerolmonomyristate, fatty acid ethoxylates or other alkenes.
E. All functionalizing compounds shown in Table I, such as ODT, MDA, SMPS, etc.
F. Simple salts, such as NaCl, $CaCl_2$, KCl, etc.
G. Organic acids, such as citric acid, acetic acid, benzoic acid, etc.
H. Organic bases, such as primary-, secondary-, tertiary- or quaternary amines.

Non-Limiting Examples of Filler
Any suitable fillers may be used, such as oxides or carbonates, such as silia particles, calcium carbonate, talc, $TiO_2$, etc.

Non-Limiting Examples of Plasticizer
Any suitable plasticizers may be used, such as:

A. Dicarboxylic/tricarboxylic ester-based plasticizers:
   Bis(2-ethylhexyl) phthalate (DEHP), Diisononyl phthalate (DINP), Di-n-butyl phthalate (DnBP, DBP), Butyl benzyl phthalate (BBzP, Diisodecyl phthalate (DIDP), Di-n-octyl phthalate (DOP or DnOP), Diisooctyl phthalate (DIOP), Diethyl phthalate (DEP), Diisobutyl phthalate (DIBP) Di-n-hexyl phthalate B. Trimellitates:
   Trimethyl trimellitate (TMTM), Tri-(2-ethylhexyl) trimellitate (TEHTM-MG), Tri-(n-octyl,n-decyl) trimellitate (ATM), Tri-(heptyl,nonyl) trimellitate (LTM), n-octyl trimellitate (OTM)

C. Adipates, sebacates, maleates:
   Bis(2-ethylhexyl)adipate (DEHA)
   Dimethyl adipate (DMAD)
   Monomethyl adipate (MMAD)
   Dioctyl adipate (DOA)
   Dibutyl sebacate (DBS)
   Dibutyl maleate (DBM)
   Diisobutyl maleate (DIBM)

D. Other plasticizers:
   Benzoates
   Terephthalates such as Dioctyl terephthalate/DEHT, 1,2-Cyclohexane dicarboxylic acid diisononyl ester, Epoxidized vegetable oils alkyl sulphonic acid phenyl ester (ASE).
   Sulfonamides
   N-ethyl toluene sulfonamide (o/p ETSA), ortho and para isomers
   N-(2-hydroxypropyl)benzene sulfonamide (HP BSA)
   N-(n-butyl)benzene sulfonamide (BBSA-NBBS)
   Organophosphates
   Tricresyl phosphate (TCP)
   Tributyl phosphate (TBP)
   Glycols/polyethers
   Triethylene glycol dihexanoate (3G6, 3GH) Tetraethylene glycol diheptanoate (4G7).

Non-Limiting Examples of Ink and Film Compositions
The following are non-limiting examples of exemplary ink compositions. Examples A1, A2, B1 and B2 are dilute inks (low nanowire content) and examples C and D are concentrated inks (high nanowire content).

Table II illustrates exemplary dilute ink compositions, in which examples A1 and A2 are dilute inks with a nanowire density corresponding to $1*10^7$ NW/$cm^3$ or 0.001 mg/ml and $1*10^8$ NW/$cm^3$ or 0.01 mg/ml, respectively. Example B1 is a dilute ink with a higher nanowire density corresponding to $1*10$ NW/$cm^3$ or 0.093 mg/ml, while example B2 is an ink with an even higher nanowire density corresponding to $1*10^{10}$ NW/$cm^3$ or 0.93 mg/ml. Example B2 contains the polymer binder matrix material, while it is omitted in the other example compositions.

TABLE II

| | Examples of dilute inks | | | |
|---|---|---|---|---|
| | Example A1 mg/ml | Example A2 mg/ml | Example B1 mg/ml | Example B2 mg/ml |
| NWs | 0.000927 | 0.00926 | 0.0926 | 0.93 |
| Functionalizing compounds | 0.00004 | 0.0004 | 0.004 | 0.04 |
| Polymer matrix/binder (e.g., water-insoluble polymer, for example Ethylcellulose) | — | — | — | 16.25 |
| Filler (for example SiO2 particle) | — | 0.00096 | — | — |

TABLE II-continued

| | Examples of dilute inks | | | |
|---|---|---|---|---|
| | Example A1 mg/ml | Example A2 mg/ml | Example B1 mg/ml | Example B2 mg/ml |
| Compatibilizer (for example stearic acid) | 0.0015 | — | — | 1.0 |
| Solvent | 949.97 | 950 | 949.9 | 932.74 |

Table III illustrates exemplary concentrated ink compositions, in which the solid content of the ink is 10 weight percent. Example C has a lower nanowire density corresponding to 4.40 mg/ml than example D which has a higher nanowire density corresponding to 75.91 mg/ml.

TABLE III

| | Examples of high solid content inks | |
|---|---|---|
| | Example C mg/ml | Example D mg/ml |
| NWs | 4.40 | 75.91 |
| Polymer/binder | 81.67 | 43.11 |
| Fillers | 4.56 | 2.408 |
| Compatibilizers (including functionalizing compound) | 7.30 | 3.85 |
| Solvent | 881.46 | 1127.58 |

The ink of compositions C or D or similar composition type (e.g., an ink with a solid content of 5-25 wt %) can be used to form films containing uni-directionally oriented nanowires using the methods described herein. The ink may have a solid content of 0.001 mg/ml to 1700 mg/ml, such as 0.05 mg/ml to 970 mg/ml, including a nanowire content of 0.001 to 1700 mg/ml, such as 0.001 to 970 mg/ml.

Examples E, F and G described below are typical solid film compositions. These compositions were based on the following non-limiting nanowire dimensions, densities and composition of matrix material. The nanowires are GaAs nanowires which about 1,000-10,000 nm long, such as 2,000-3,000 nm long and about 50-500 nm, such as 100-200 nm in diameter. The film weight is in a range of 1.6-12 g/m$^2$ and the density of the nanowires is in a range of 5-15 NWs/μm$^2$.

In example E, the total composition of the film has the following component ranges:

| | |
|---|---|
| Nanowires | from 8 to 40 weight % |
| Polymer matrix | from 50 to 92 weight % |
| The sum of compatibilizer and plasticizer | from 0 to 10 weight % |

In other words, the compatibilizer and plasticizer are optional in this composition and may be omitted.

In example F, the total composition of the film has the following component ranges:

| | |
|---|---|
| Nanowires | from 5 to 61 weight % |
| Polymer matrix | from 35 to 80 weight % |
| Filler | from to 0 to 5 weight % |
| The sum of compatibilizer and plasticizer | from 3 to 8 weight % |

In example G, the total composition of the film has the following component ranges:

| | |
|---|---|
| Nanowires | from 3 to 61 weight % |
| Polymer matrix | from 35 to 50 weight % |
| Filler | from to 5 to 32 weight % |
| The sum of compatibilizer and plasticizer | from 1 to 15 weight % |

Figure 11:
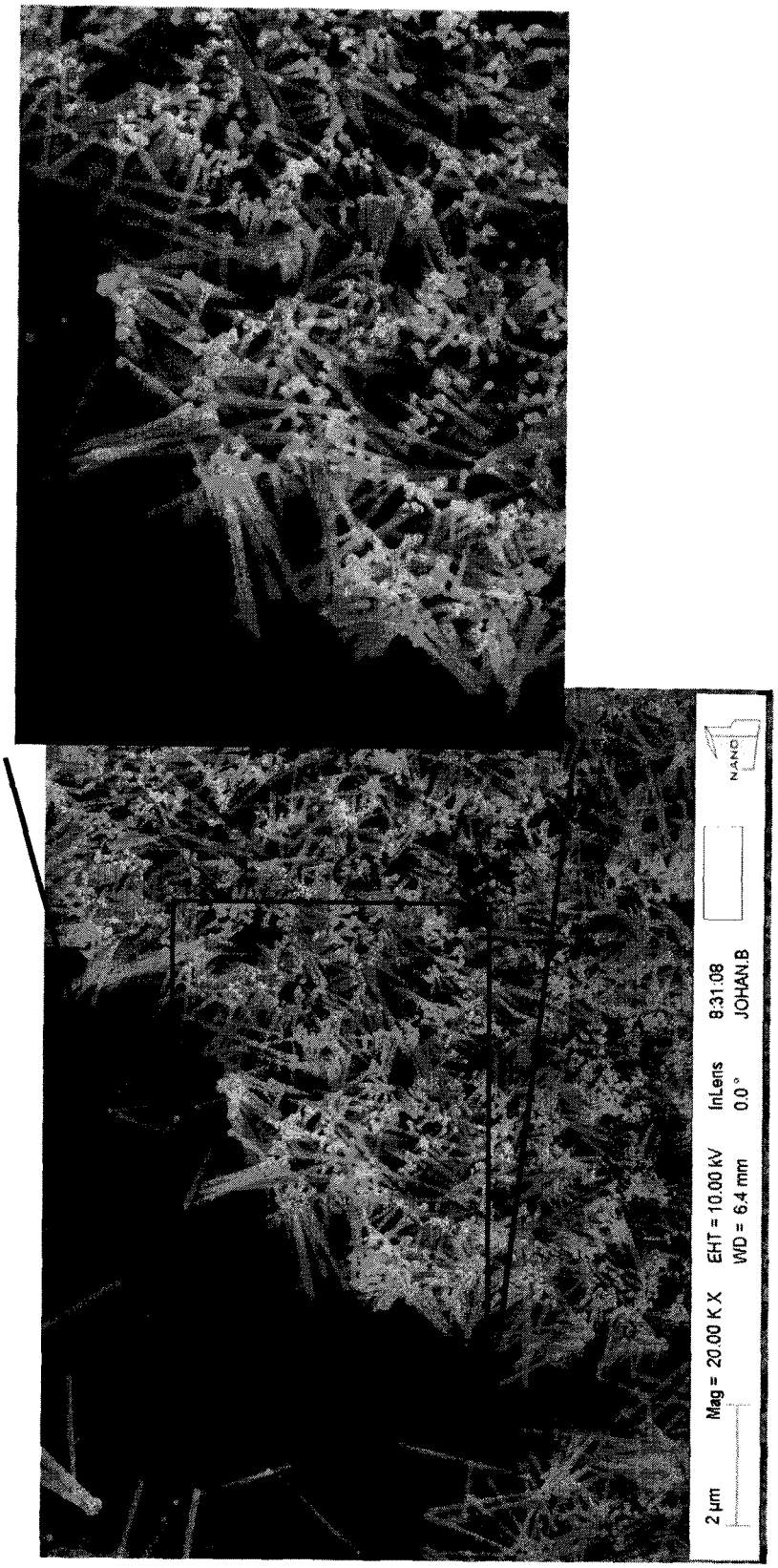
FIG. 11 is an SEM image of uni-directionally aligned nanowires captured on a Si substrate.

Using an ink composition in the ranges given above, such as composition of example B1, the nanowires may be aligned uni-directionally by depositing the nanowires on a liquid surface and capturing the interfacial film on a solid substrate, such as silicon wafer. The wafer is either partially immersed in the liquid (e.g., using the LB method) or approached from above using the LS method. An SEM image of the uni-directionally aligned nanowires according to example B1 is shown in FIG. 11.

The aligned nanowires described above or the composite film described above may be used in solar cells (e.g., nanowires containing the semiconductor p-n junction or forming a Schottky junction with an electrode), in fuel cell or battery applications (e.g., as nanowire electrodes on the electrolyte), for decorative purposes, as part of a sensor (e.g., photodetector or chemical sensor), or for any other suitable purpose where aligned nanowires are desired.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A composition comprising:
a polar or semi-polar solvent; and
rod-shaped semiconductor nanowires suspended in and floating on a surface of the solvent, the rod-shaped semiconductor nanowires suspended in the solvent each comprising a first portion and a second portion, wherein the first portion of each rod-shaped semiconductor nanowire comprises a first functionalizing compound and the second portion of each rod-shaped semiconductor nanowire comprises a second functionalizing compound, wherein the second functionalizing compound is different from the first functionalizing compound;
wherein the first portion of the rod-shaped semiconductor nanowires comprises a metal nanowire growth catalyst particle, and wherein the second portion of the rod-shaped semiconductor nanowires comprises one or more of GaAs, InP, InAs, GaAs$_x$P$_{1-x}$, In$_x$Ga$_{1-x}$P, InGaAsP, GaN, InN, Ga$_x$In$_{1-x}$N, GaP, InSb, GaSb, In$_x$Al$_{1-x}$Sb, Ga$_x$Al$_{1-x}$Sb, AlN, BN, Si, or SiC, wherein one of the first and the second functionalizing compounds comprises a charged compound and the other one of the first and the second functionalizing compounds comprises a non-charged compound,
wherein the charged compound comprises an anchor portion selected from a group consisting of thiol, carboxylic acid, phosphonic acid, disulfide, silane, sulfonate and phosphine, and a functional group selected from a group consisting of sulfonate, phosphonate, carboxylate, amine, and polyether,
wherein the non-charged compound comprises an anchor portion selected from a group consisting of thiol, carboxylic acid, phosphonic acid, disulfide, silane, sulfonate and phosphine, and a functional group selected from alkane, alkene, alkyne and a fluoro compound, and wherein the semiconductor nanowires are aligned perpendicular to the surface of the solvent.

2. The composition of claim 1, wherein the solvent is polar.

3. The composition of claim 1, wherein:

the charged compound is selected from a group consisting of sodium mercaptopropane sulfonate, sodium mercaptoethane sulfonate, 2-mercaptosuccinate, 12-mercaptododecanoic acid, (11-mercaptoundecyl)-N,N,N-trimethylammonium bromide, (12-Phosphonododecyl) phosphonic acid, lipoic acid, (2-ammonioethyl)di-tert-butylphosphonium bis(tetrafluoroborate) and (3-aminopropyl)triethoxysilane, 12-mercaptododecanoic acid NHS ester; and the non-charged compound is selected from a group consisting of pentanethiol, perfluorodecane thiol, dodecyltrichloro silane, stearic acid, decyl phosphonic acid, triphenyl phosphine and octadecanethiol.

4. The composition of claim 1, wherein one of the first and the second functionalizing compounds comprises a fluorinated compound and the other one of one of the first and the second functionalizing compounds comprises a non fluorinated compound.

5. The composition of claim 1, wherein the first functionalizing compound comprises 1-octadecanethiol, the second functionalizing compound comprises (12-phosphonodecyl) phosphonic acid and the polar or semi-polar solvent comprises cyclopentanone.

6. The composition of claim 1, wherein the second portions of the rod-shaped semiconductor nanowires are not affixed to another rod-shaped semiconductor nanowire.

7. A composition comprising:

a polar or semi-polar solvent; and rod-shaped semiconductor nanowires suspended in and floating on a surface of the solvent, the rod-shaped semiconductor nanowires suspended in the polar or semi-polar solvent consisting of a first portion and a second portion of the rod-shape, wherein the first portion of the rod-shaped semiconductor nanowire comprises a first functionalizing compound;

wherein the first portion of all of the semiconductor nanowires in the solvent comprise a metal nanowire growth catalyst particle, and wherein the second portion of all of the semiconductor nanowires in the solvent comprises one or more of GaAs, InP, InAs, $GaAs_xP_{1-x}$, $In_xGa_{1-x}P$, InGaAsP, GaN, InN, $Ga_xIn_{1-x}N$, GaP, InSb, GaSb, $In_xAl_{1-x}Sb$, $Ga_xAl_{1-x}Sb$, AlN, BN, Si, or SiC, wherein the first functionalizing compound comprises sodium mercaptopropane sulfonate and the solvent comprises at least one of methyl isobutyl ketone and ethanol, and wherein the semiconductor nanowires are aligned perpendicular to the surface of the solvent.

8. The composition of claim 7, wherein the first portion comprises gold.

9. The composition of claim 7, wherein the second portions of the rod-shaped semiconductor nanowires are not affixed to another rod-shaped semiconductor nanowire.

* * * * *